United States Patent
Hemink et al.

(10) Patent No.: US 7,534,690 B2
(45) Date of Patent: May 19, 2009

(54) NON-VOLATILE MEMORY WITH ASYMMETRICAL DOPING PROFILE

(75) Inventors: Gerrit Jan Hemink, Yokohama (JP); Shinji Sato, Chigasaki (JP)

(73) Assignee: SanDisk Corporation, Milpitas, CA (US)

( * ) Notice: Subject to any disclaimer, the term of this patent is extended or adjusted under 35 U.S.C. 154(b) by 113 days.

(21) Appl. No.: 11/469,281

(22) Filed: Aug. 31, 2006

(65) Prior Publication Data

US 2007/0015332 A1      Jan. 18, 2007

Related U.S. Application Data

(62) Division of application No. 10/952,689, filed on Sep. 28, 2004, now Pat. No. 7,294,882.

(51) Int. Cl.
*H01L 21/336* (2006.01)
(52) U.S. Cl. .................. 438/302; 438/201; 438/211; 438/257; 257/315; 257/E21.057; 257/E21.059; 257/E21.618; 257/E21.619; 257/E21.248; 365/185.17
(58) Field of Classification Search ........... 438/201, 438/211, 257, 302; 257/315, E21.057, E21.059, 257/E21.618, E21.619, E21.248; 365/185.17
See application file for complete search history.

(56) References Cited

U.S. PATENT DOCUMENTS

| | | | |
|---|---|---|---|
| 4,939,690 A | 7/1990 | Momodomi | |
| 5,190,887 A * | 3/1993 | Tang et al. | 438/264 |
| 5,355,006 A * | 10/1994 | Iguchi | 257/296 |
| 5,432,106 A | 7/1995 | Hong | |
| 5,638,327 A | 6/1997 | Dallabora | |
| 5,712,814 A | 1/1998 | Fratin | |
| 5,770,502 A | 6/1998 | Lee | |
| 5,783,457 A | 7/1998 | Hsu | |
| 5,830,788 A | 11/1998 | Hiroki et al. | |
| 5,837,584 A | 11/1998 | Lu | |
| 5,891,774 A | 4/1999 | Ueda | |
| 5,896,314 A | 4/1999 | Chen | |
| 5,963,808 A | 10/1999 | Lu | |
| 6,008,094 A | 12/1999 | Krivokapic et al. | |
| 6,030,869 A | 2/2000 | Odake | |
| 6,066,531 A | 5/2000 | Akiyama et al. | |
| 6,101,128 A | 8/2000 | Yamauchi | |
| 6,130,134 A | 10/2000 | Chen | |
| 6,168,637 B1 * | 1/2001 | Randolph et al. | 29/25.01 |

(Continued)

OTHER PUBLICATIONS

Notice of Allowance for U.S. Appl. No. 10/952,689 dated Jul. 3, 2007 with a allowed claims.

(Continued)

*Primary Examiner*—Andy Huynh
(74) *Attorney, Agent, or Firm*—Vierra Magen Marcus & DeNiro LLP

(57) ABSTRACT

Stacked gate structures for a NAND string are created on a substrate. Source implantations are performed at a first implantation angle to areas between the stacked gate structures. Drain implantations are performed at a second implantation angle to areas between the stacked gate structures. The drain implantations create lower doped regions of a first conductivity type in the substrate on drain sides of the stacked gate structures. The source implantations create higher doped regions of the first conductivity type in the substrate on source sides of the stacked gate structures.

1 Claim, 17 Drawing Sheets

U.S. PATENT DOCUMENTS

| | | |
|---|---|---|
| 6,265,292 B1 | 7/2001 | Parat |
| 6,297,098 B1 * | 10/2001 | Lin et al. .................... 438/264 |
| 6,300,656 B1 | 10/2001 | Ueno |
| 6,320,236 B1 | 11/2001 | Krivokapic |
| 6,384,457 B2 | 5/2002 | Tyagi |
| 6,534,787 B1 | 3/2003 | Hsu |
| 6,620,682 B1 | 9/2003 | Lee |
| 6,632,686 B1 | 10/2003 | Keshavarzi |
| 6,689,658 B2 | 2/2004 | Wu |
| 6,703,659 B2 | 3/2004 | Chan |
| 6,724,035 B2 | 4/2004 | Fujio et al. |
| 6,744,668 B1 | 6/2004 | Van Buskirk |
| 2001/0005620 A1 | 6/2001 | Tanigami |
| 2002/0008276 A1 * | 1/2002 | Fukumoto et al. ........... 257/315 |
| 2002/0100930 A1 | 8/2002 | Yaegashi |
| 2002/0190306 A1 | 12/2002 | Sasago |
| 2004/0051133 A1 | 3/2004 | Sugita |

OTHER PUBLICATIONS

Li, et al., "Effects of Source Resistance and Bit Line Column Leakage on HCI Programming," Technology Solution Organization, Freescale Semiconductor, pp. 57-60.

Yoshikawa, et al., "An Asymmetrical Lightly Doped Source Cell for Virtual Ground High-Density EPROM's," IEEE Transactions on Electron Devices, vol. 17, No. 4, Apr. 1990, pp. 1046-1051.

* cited by examiner

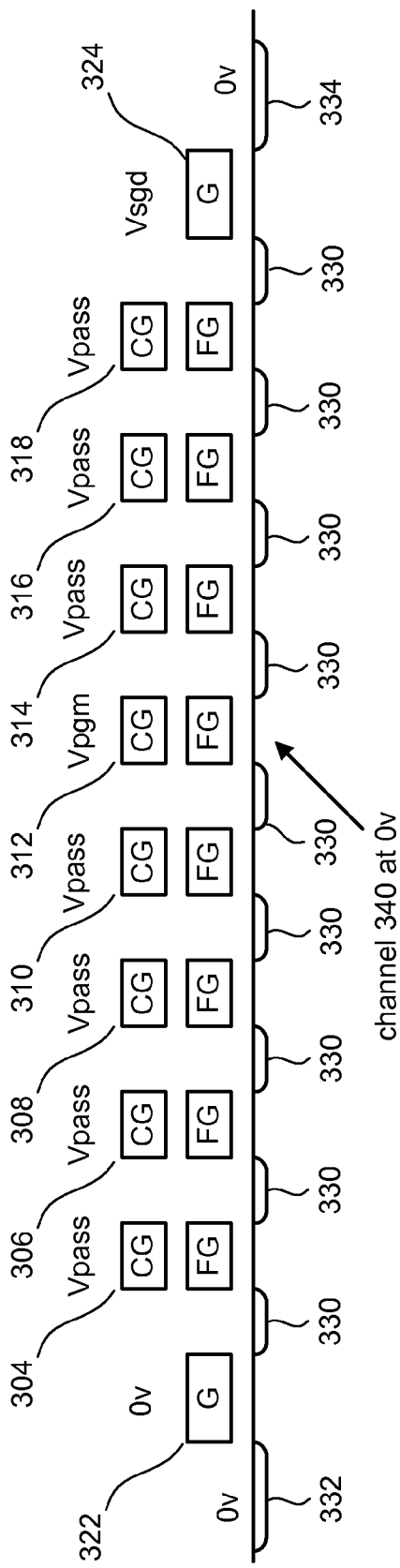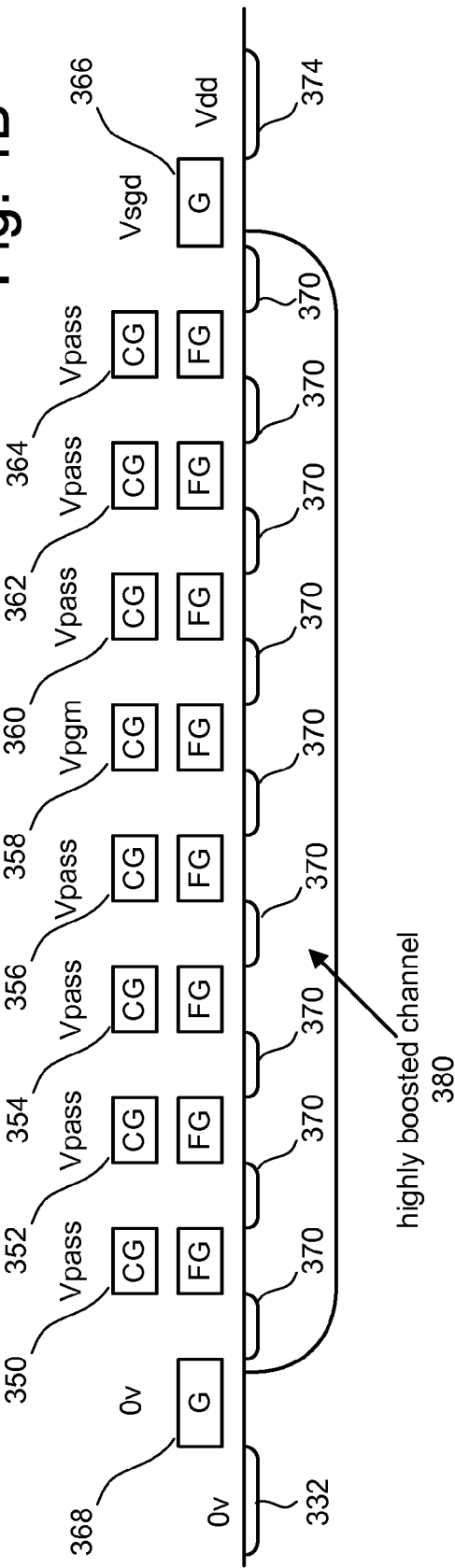

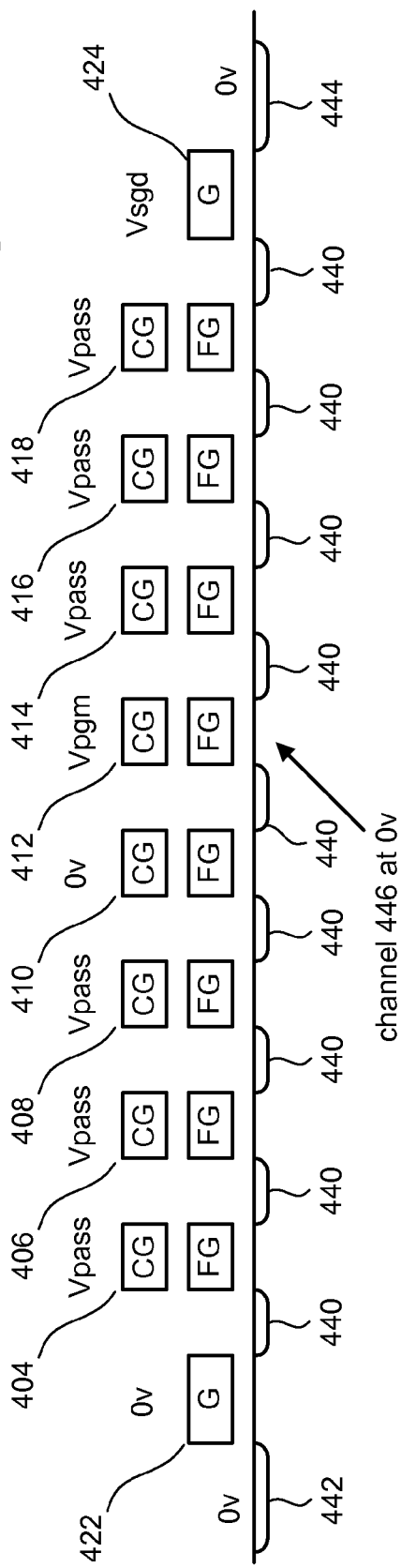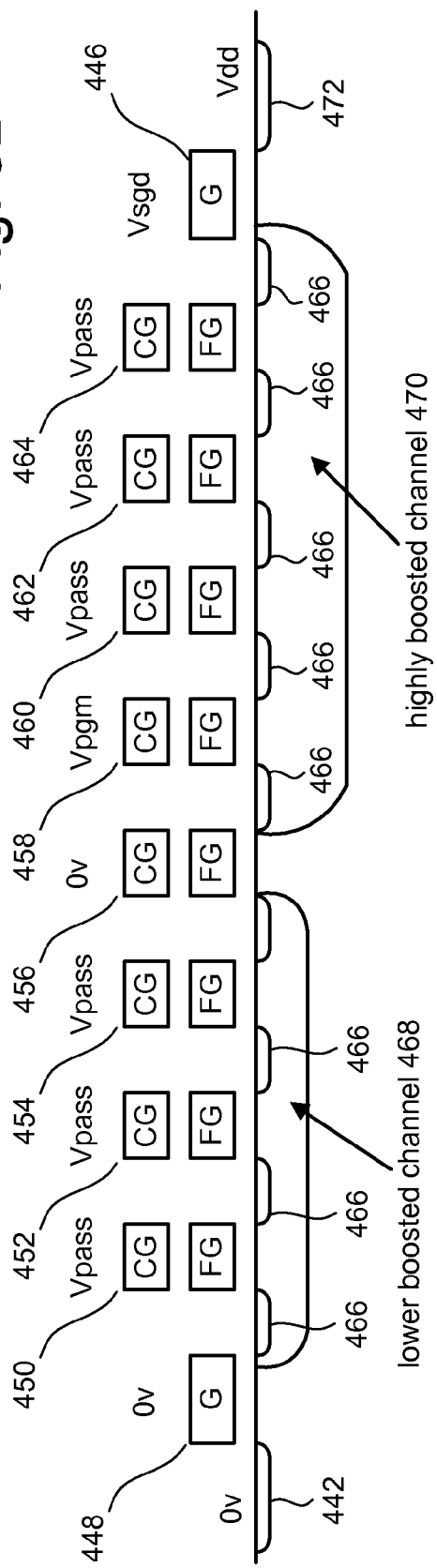

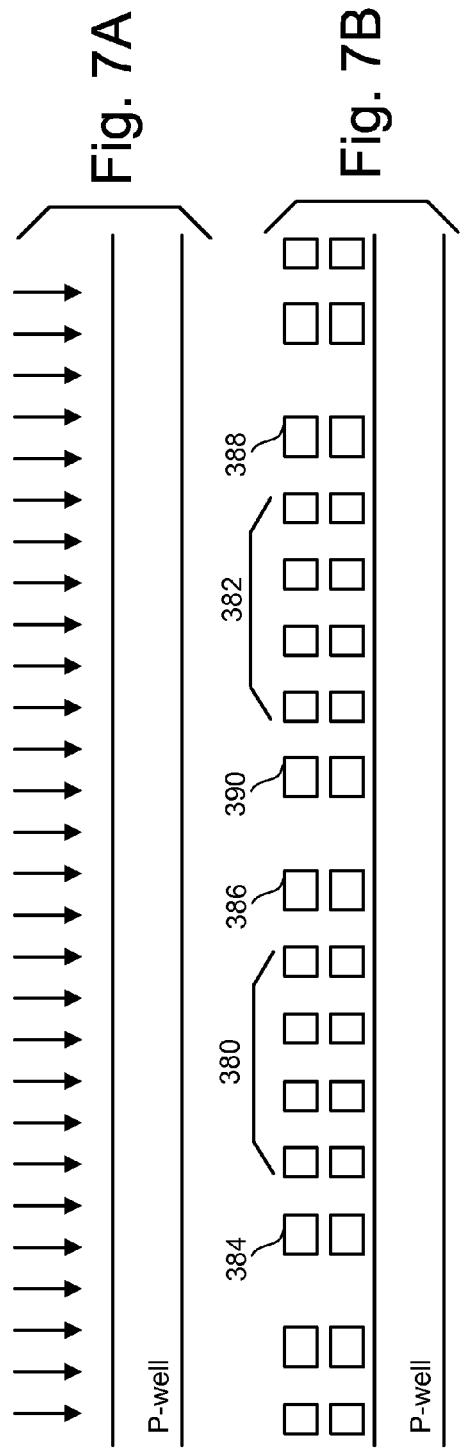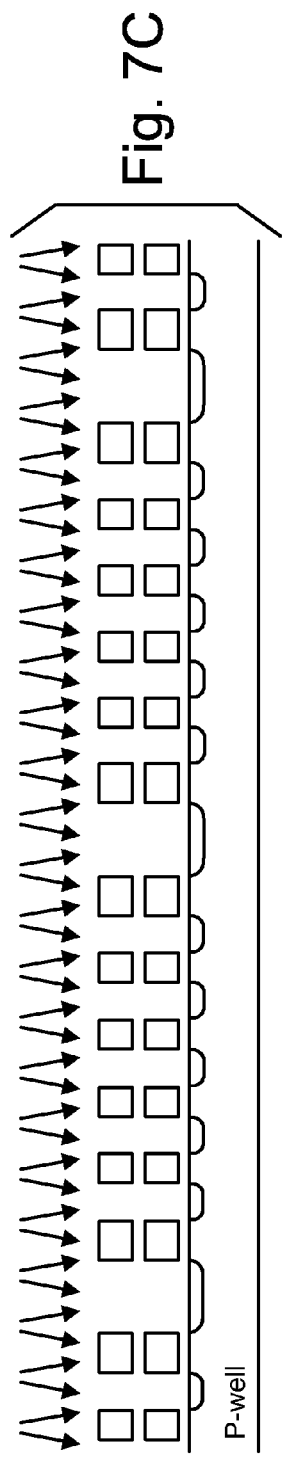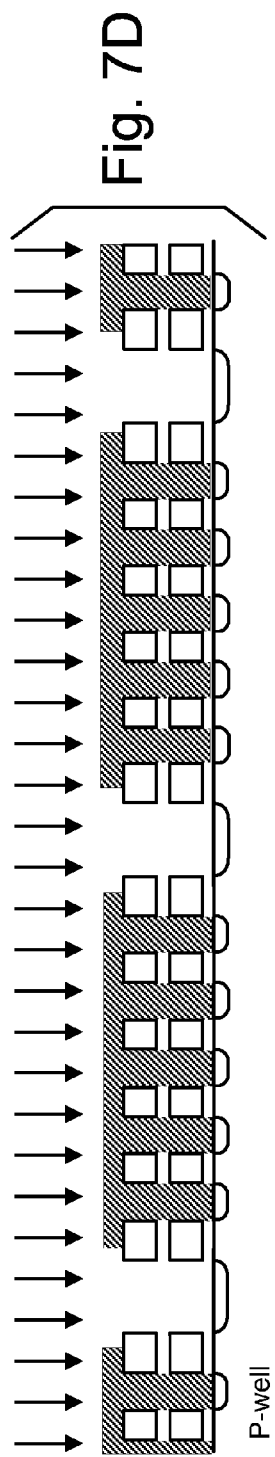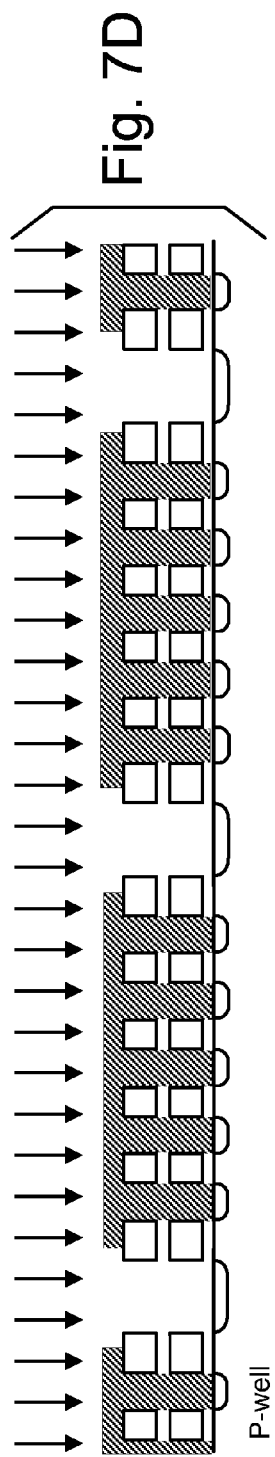

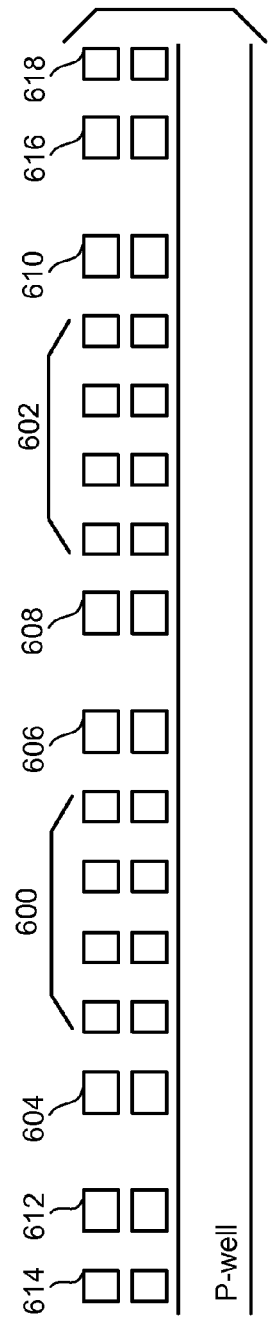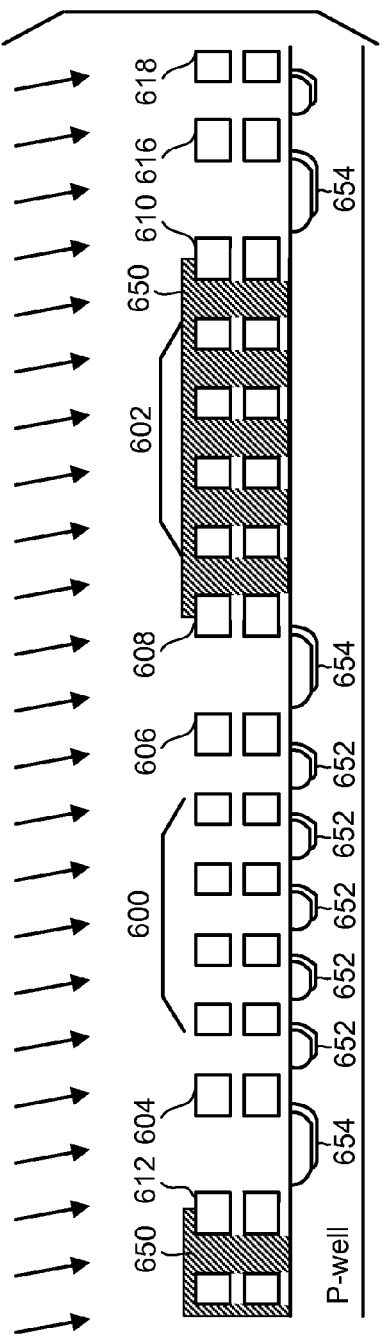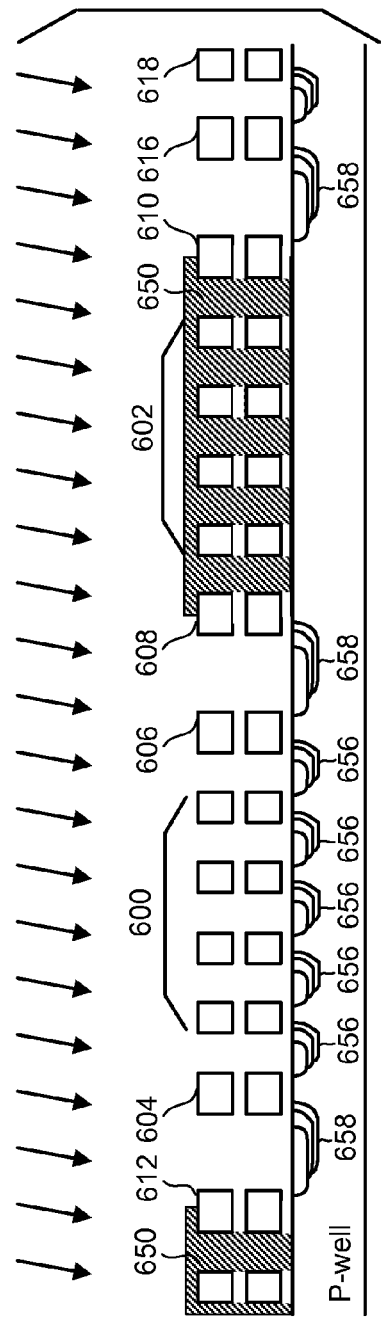

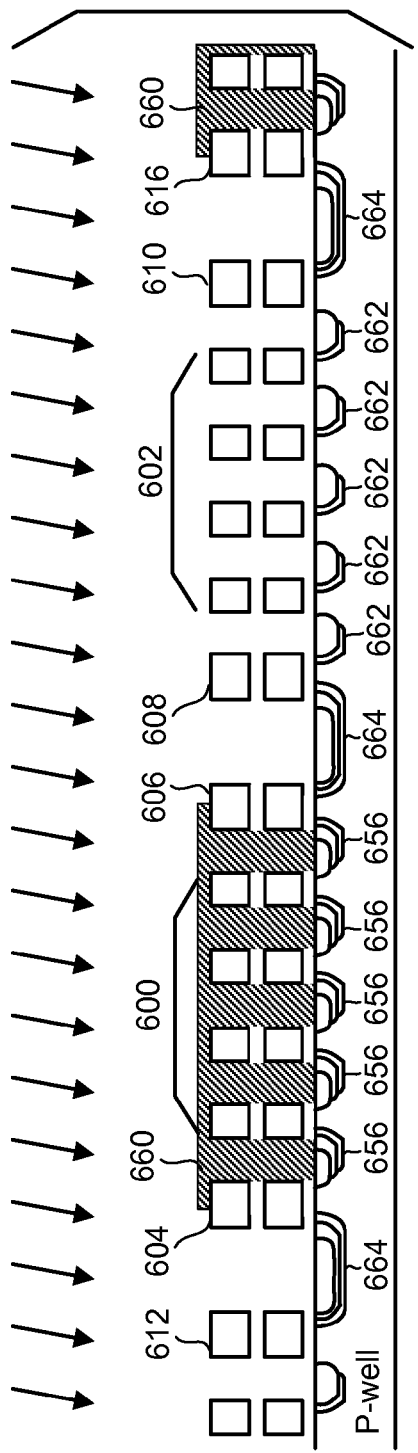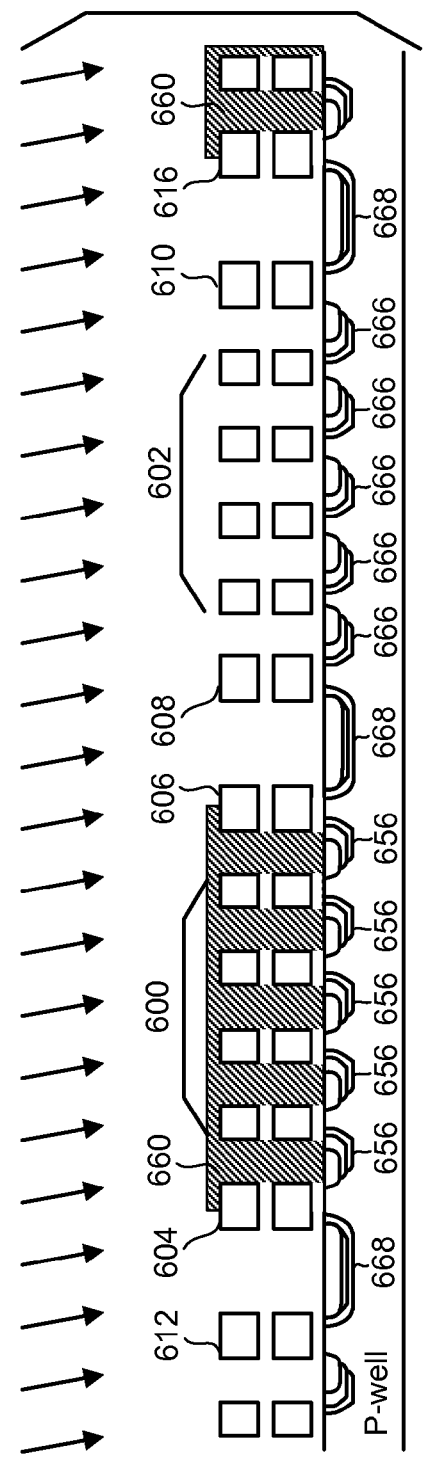

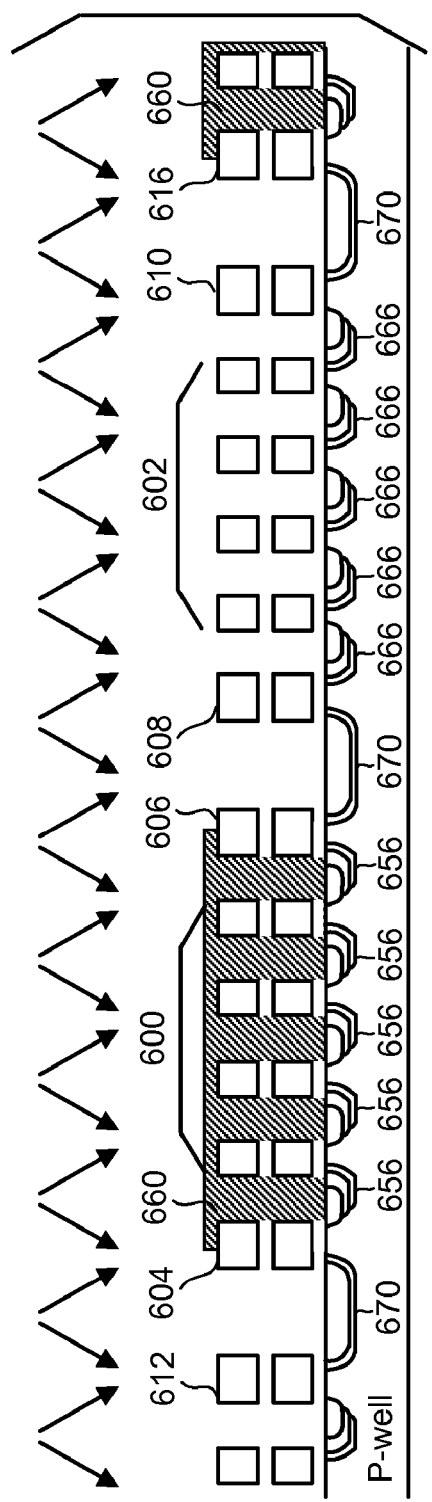

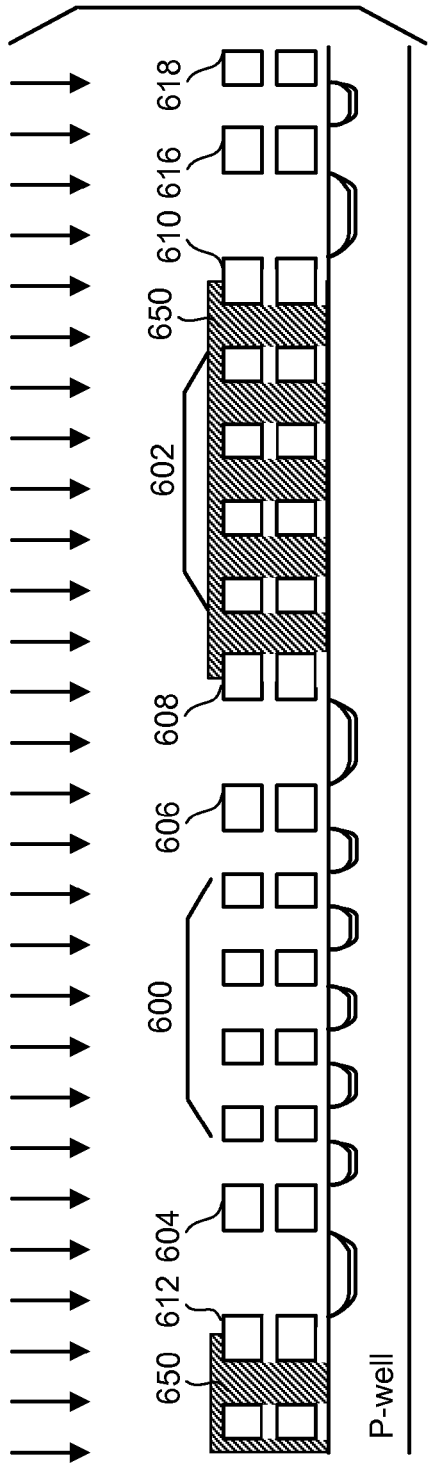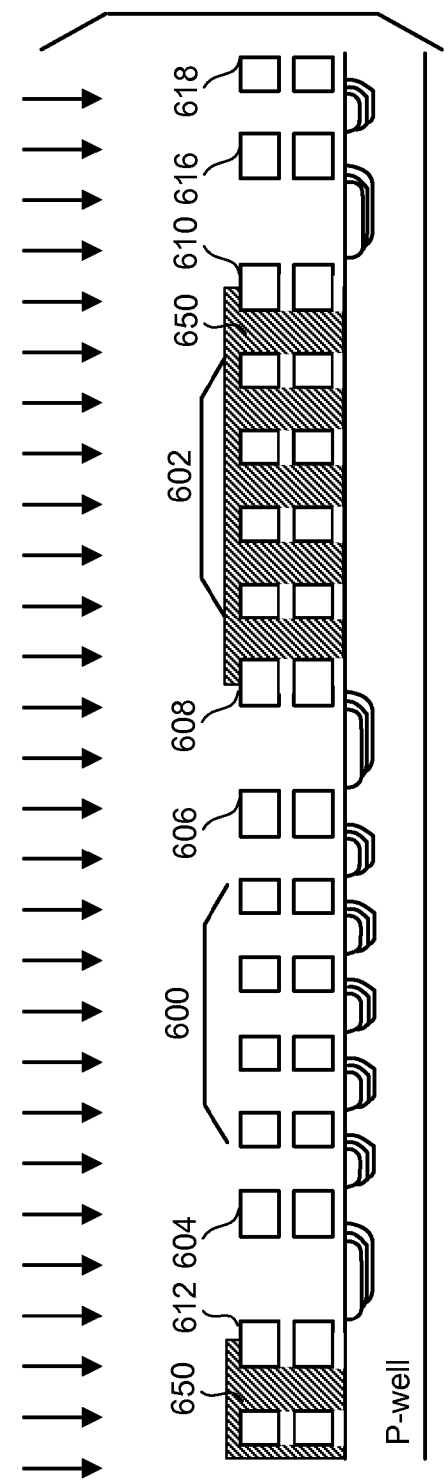

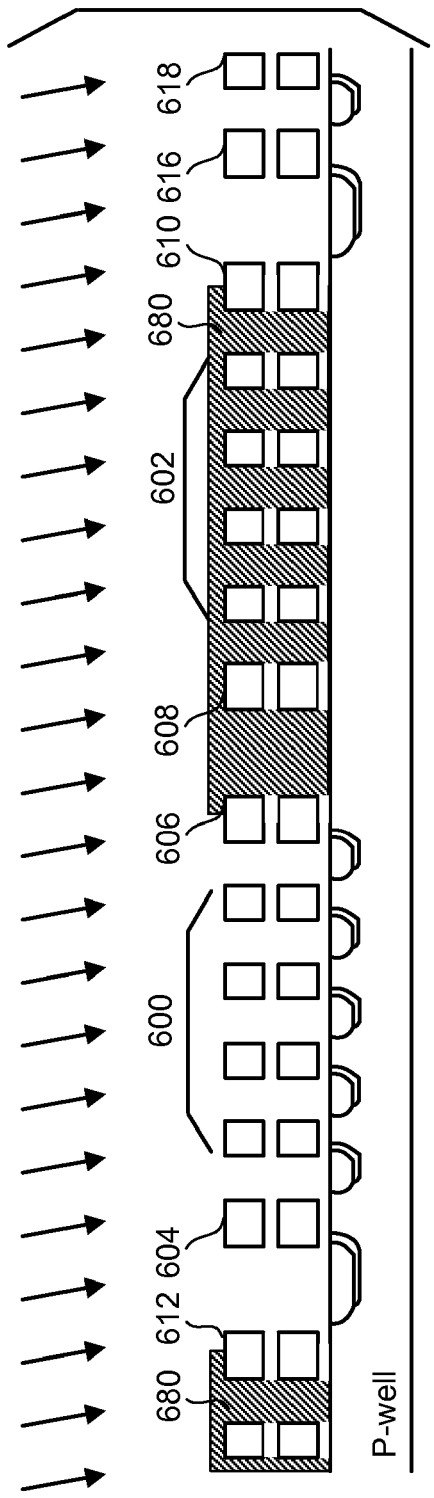
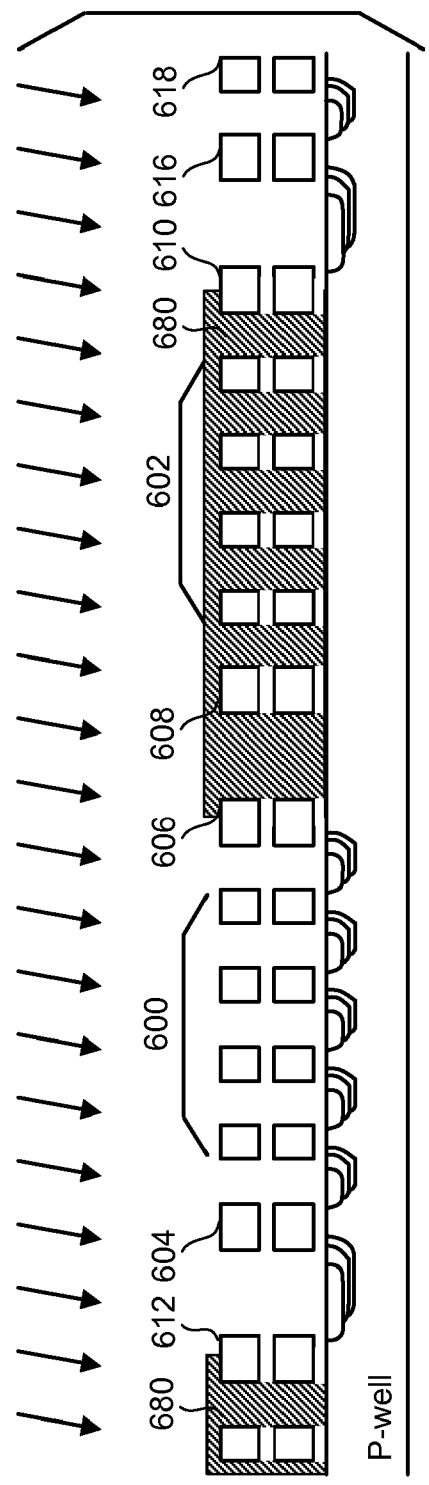

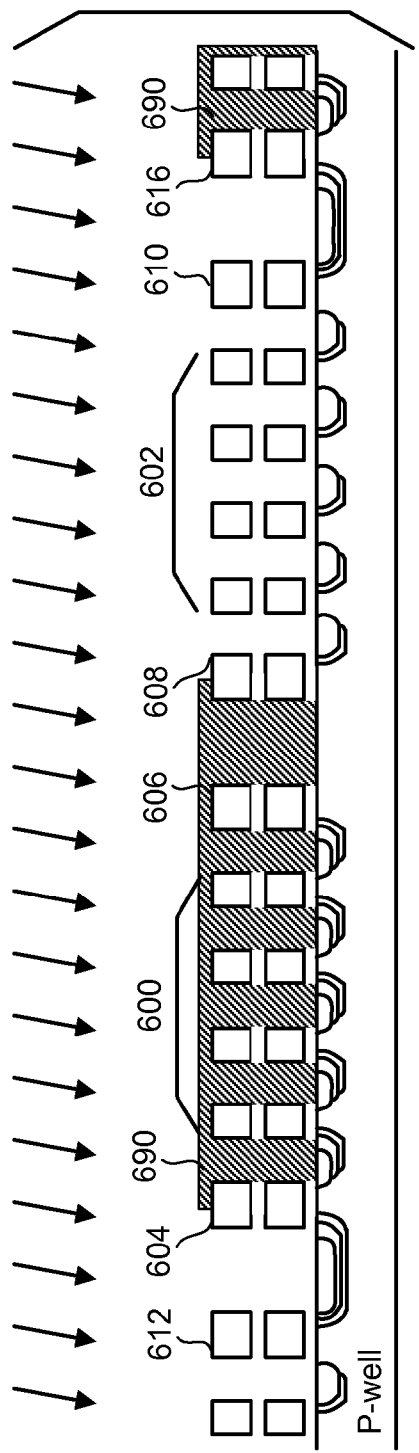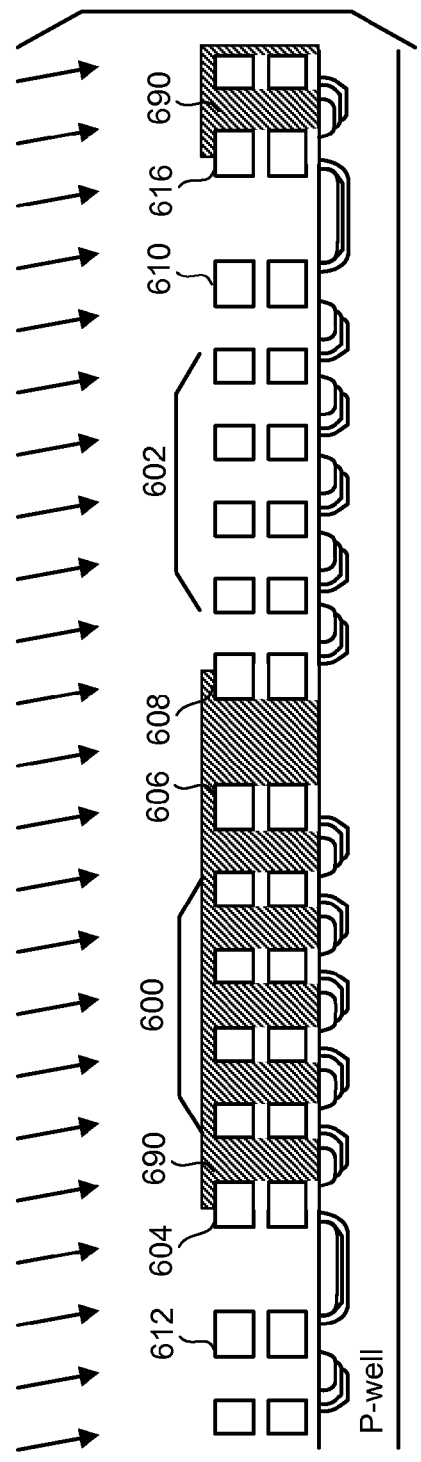

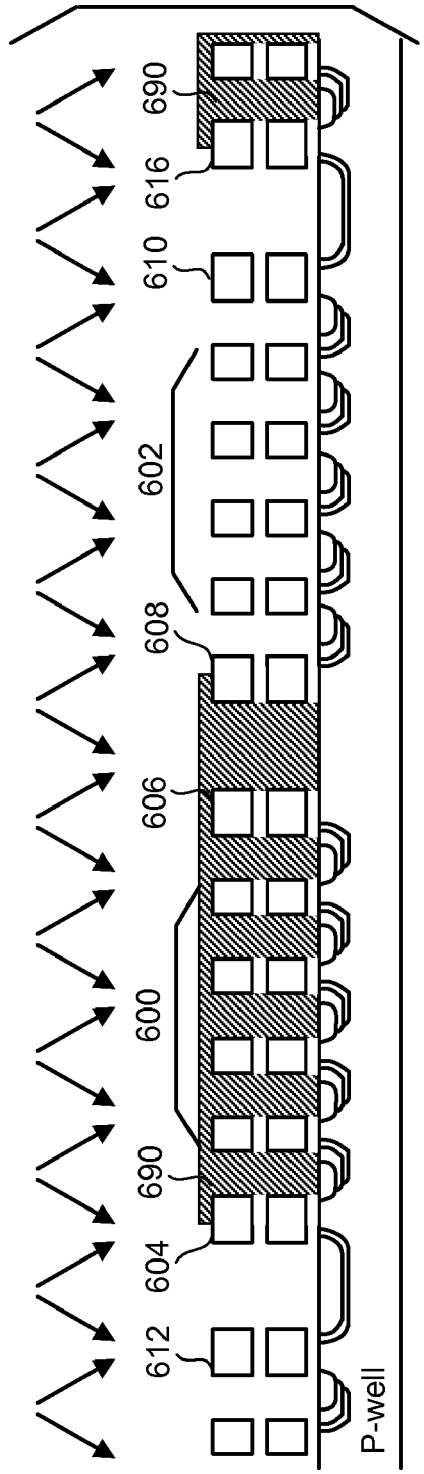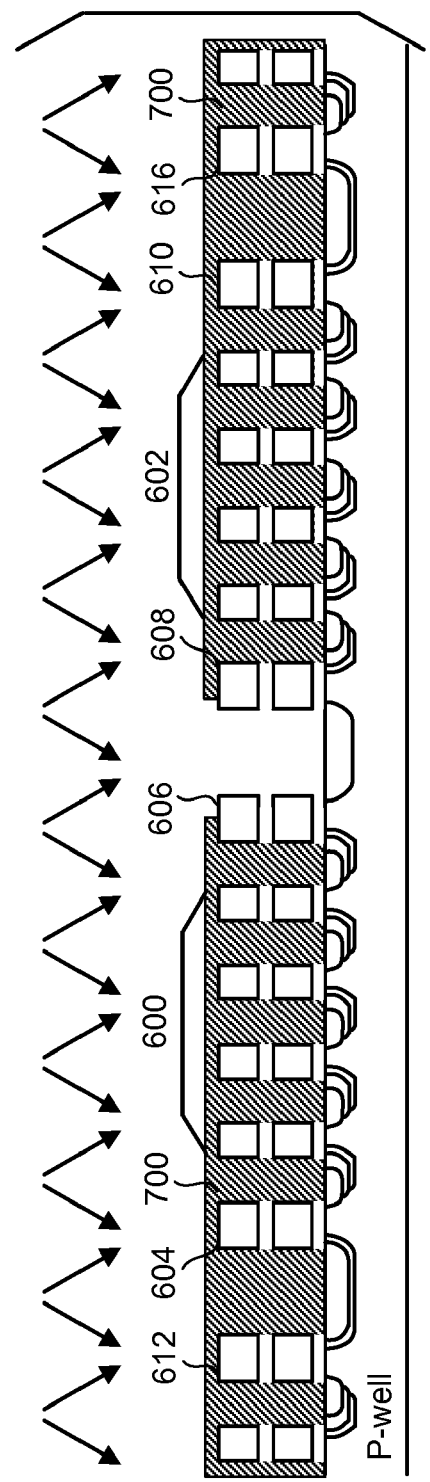

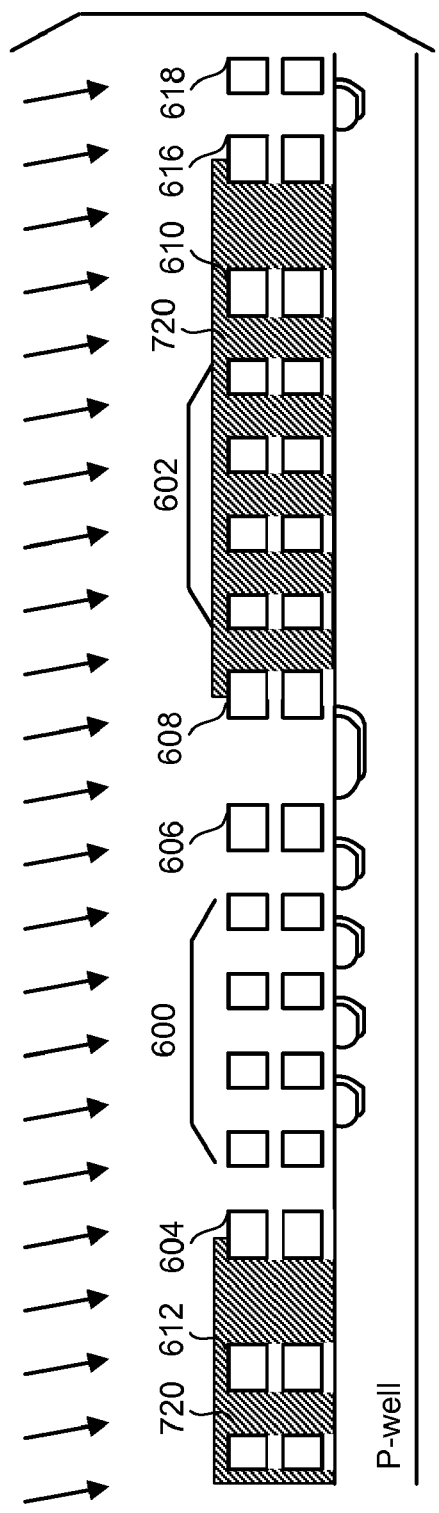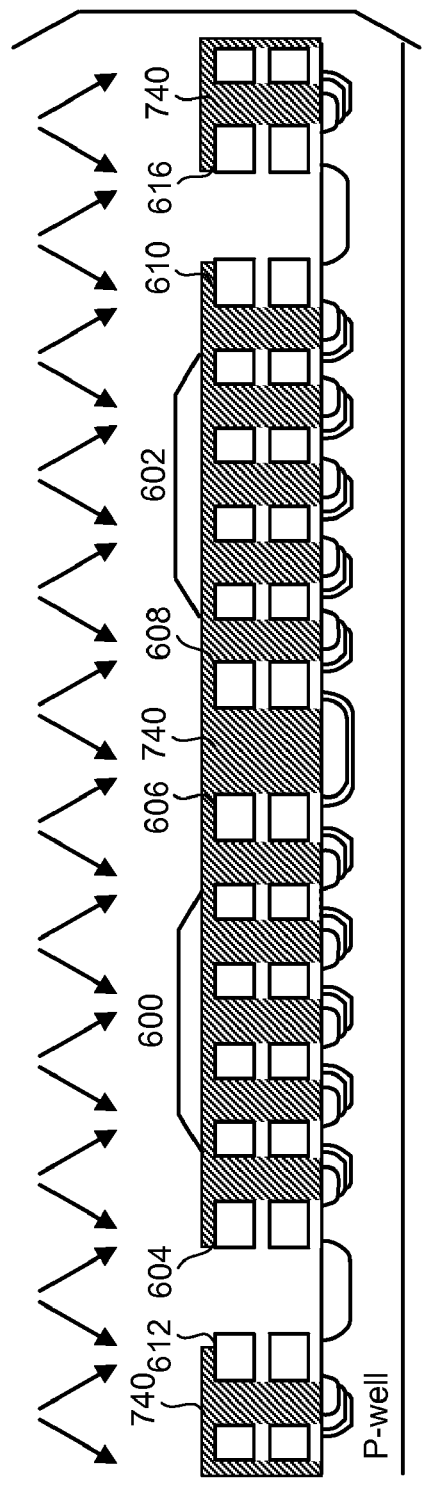

NON-VOLATILE MEMORY WITH ASYMMETRICAL DOPING PROFILE

CLAIM OF PRIORITY

This application claims the benefit of and is a divisional of U.S. application Ser. No. 10/952,689, "Non-volatile Memory with Asymmetrical Doping Profile," by Hemink, et al., filed Sep. 28, 2004, now U.S. Pat. No. 7,294,882, incorporated herein by reference.

BACKGROUND OF THE INVENTION

1. Field of the Invention

The present invention relates to a non-volatile memory cell with asymmetrical doping profile for source and drain regions.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Many types of EEPROM and flash memories utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 shows four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

A typical architecture for a flash memory system using a NAND structure will include several NAND strings. For example, FIG. 3 shows three NAND strings 202, 204 and 206 of a memory array having many more NAND strings. Each of the NAND strings of FIG. 3 includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each NAND string is connected to the source line by its select transistor (e.g. select transistor 230 and select transistor 250). A selection line SGS is used to control the source side select gates (e.g., 230 and 250). The various NAND strings are connected to respective bit lines by select transistors 220, 240, etc., which are controlled by select line SGD. Word line WL3 is connected to the control gates for memory cell 222 and memory cell 242. Word line WL2 is connected to the control gates for memory cell 224 and memory cell 244. Word line WL1 is connected to the control gates for memory cell 226 and memory cell 246. Word line WL0 is connected to the control gates for memory cell 228 and memory cell 248. Each bit line and the respective NAND string(s) that are connected to that bit line via a bit line contact comprise the columns of the array of memory cells. The word lines (WL3, WL2, WL1 and WL0) comprise the rows of the array. Each word line connects the control gates of the memory cells in the row. For example, word line WL2 is connected to the control gates for memory cells 224, 244 and 250. The NAND strings connect to the bit lines via bit line contacts. Bit lines are shared with multiple NAND strings. Typically, the bit line runs on top of the NAND strings in a direction perpendicular to the word lines and is connected to sense amplifiers.

Each memory cell can store data (analog or digital). When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after a program operation is positive and defined as logic "0." When the threshold voltage is negative and a read is attempted by applying 0 volts to the control gate, the memory cell will turn on to indicate logic one is being stored. When the threshold voltage is positive and a read operation is attempted, the memory cell will not turn on, which indicates that logic zero is stored.

A memory cell can also store multiple levels of information, for example, multiple bits of digital data. In the case of storing multiple levels of data, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00."

Relevant examples of NAND type flash memories and their operation are provided in the following U.S. Patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; U.S. patent application. Ser. No. 09/893,277 (Publication No. US2003/0002348); and U.S. patent application. Ser. No. 10/379,608.

When programming a flash memory cell, a program voltage is applied to the control gate and the bit line is grounded.

Electrons from the channel area under the floating gate are injected into the floating gate. When electrons accumulate in the floating gate, the floating gate becomes negatively charged and the threshold voltage of the memory cell is raised. To apply the program voltage to the control gate of the cell being programmed, that program voltage is applied on the appropriate word line. As discussed above, that word line is also connected to one memory cell in each of the other NAND strings that utilize the same word line. For example, when programming memory cell 224 of FIG. 3, the program voltage will also be applied to the control gate of memory cell 244 because both memory cells share the same word line. A problem arises when it's desired to program one cell on a word line without programming other cells connected to the same word line, for example, when it's desired to program memory cell 224 and not memory cell 244. Because the program voltage is applied to all memory cells connected to a word line, an unselected memory cell (a memory cell that is not to be programmed) on the same word line may become inadvertently programmed. For example, cell 244 is adjacent to cell 224. When programming cell 224, there is a concern that cell 244 might unintentionally be programmed. The unintentional programming of the unselected cell on the selected word line is referred to as "program disturb." In some flash memory systems, a programming process will simultaneously program memory cells sharing a common word line that are on every other NAND string; therefore, the memory cells connected to that word line but on the unselected NAND strings can be subjected to program disturb.

Several techniques can be employed to prevent program disturb. In one method known as "self boosting," the unselected NAND strings are electrically isolated from the corresponding bit lines and a pass voltage (e.g. 7-10 volts, but not limited to this range) is applied to the unselected word lines during programming. The unselected word lines couple to the channel area of the unselected NAND strings, causing a voltage (e.g., 6-10 volts) to exist in the channel of the unselected NAND strings, thereby reducing program disturb. Self boosting causes a boosted voltage to exist in the channel which lowers the voltage differential across the tunnel oxide and hence reduces program disturb. Note that the boosted channel voltage can vary largely since the boosted channel voltage depends on the value of the pass voltage and also on the state of the memory cells, with boosting being most efficient (highest channel voltage) when all memory cells in the NAND string are in the erased state.

FIGS. 4A and 4B depict NAND strings that are being programmed and inhibited using the self-boosting method. FIG. 4A depicts a NAND string being programmed. The NAND string of FIG. 4A includes eight memory cells 304, 306, 308, 310, 312, 314, 316 and 318. Each of those eight memory cells includes a floating gate (FG) and a control gate (CG). Between each of the floating gates are source/drain regions 330. At one end of the NAND string is a drain side select gate 324. The drain side select gate 324 connects the NAND string to the corresponding bit line via bit line contact 334. At another end of the NAND string is a source side select gate 322. Source side select gate 322 connects the NAND string to common source line 332. During programming, the memory cell selected for programming (e.g., memory cell 312) receives a program voltage Vpgm on its associated word line. The program voltage Vpgm can typically vary between 12 to 24 volts. In one embodiment, the program voltage signal is a set of pulses which increase in magnitude with each new pulse. A pass voltage Vpass of approximately 8 volts is applied to the control gates of the memory cells that are not selected for programming. Source side select gate 322 is in an isolating state, receiving a zero gate (G) voltage. A low voltage is applied to the common source line 332. This low voltage can be zero volts. However, the source voltage can also be slightly higher than zero volts to provide better isolation characteristics of the source side select gate. A voltage Vsgd, which is typically in the range of the power supply voltage Vdd (e.g., 2.5 volts), is applied to drain side select gate 324. Zero volts is applied to bit line contact 334 via the corresponding bit line to enable programming of the selected memory cell 312 string. Channel 340 is at or close to zero volts. Because of the voltage differential between the channel and the floating gate, electrons tunnel through the gate oxide (also commonly referred to as tunnel oxide) into the floating gate by Fowler-Nordheim tunneling.

The NAND string of FIG. 4B depicts a NAND string being inhibited from programming. The NAND string includes eight memory cells 350, 352, 354, 356, 358, 360, 362 and 364. The NAND string also includes drain side select gate 366 connecting the NAND string to the corresponding bit line via bit line contact 374, and source side select gate for 368 connecting the NAND string to common source line 332. Between each of the floating gate stacks are source/drain regions 370. The NAND string of FIG. 4B has Vsgd applied to the gate of the drain side select gate 366, zero volts applied to the gate of the source side select gate 368 and zero volts (or a slightly higher voltage) at the common source line 332. Bit line contact 374 receives the power supply voltage Vdd via the corresponding bit line in order to inhibit the programming of memory cell 358.

When Vdd is applied, the drain side select transistor 366 will initially be in a conducting state; therefore, the channel area under the NAND string will partly be charged up to a higher potential (higher than zero volts, but less than Vdd). This charging is commonly referred to as pre-charging. The pre-charging will stop automatically when the channel potential has reached a certain level given by Vsgd-Vt, where Vt equals the threshold voltage of the drain side select gate 366. After the channel has reached that potential, the select gate transistor is non-conducting. The voltages Vpass and Vpgm are ramped up from zero volts to their respective final values (not necessarily at the same time), and because the drain side select gate transistor 366 is in a non-conducting state, the channel potential will start to rise because of the capacitive coupling between the word lines and the channel area. This phenomenon is called self boosting. It can be seen from FIG. 4B that channel 380 is boosted, more or less uniformly, to a boosting voltage. Because the voltage differential between the floating gate of memory cell 358 and channel 380 has been reduced, programming is inhibited.

More information about programming NAND flash memory, including self boosting techniques, can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety.

A NAND string is typically (but not always) programmed from the source side to the drain side, for example, from memory cell 304 to memory cell 318 (see FIG. 4A). When the programming process is ready to program the last (or near the last) memory cell of the NAND string, if all or most of the previously programmed cells on the string being inhibited were programmed, then there is negative charge in the floating gates of the previously programmed cells. Because of this negative charge on the floating gates, the boosting potential is reduced and there still may be program disturb on the last few word lines. This problem is exacerbated for multi-level memory cells since the programmed threshold voltage can be higher for multi-level memory cells, resulting in less boosting. One attempt to address this problem is Erased Area Self Boosting ("EASB"). EASB attempts to isolate the channel of previously programmed cells from the channel of the cell being inhibited.

In the EASB method, the channel area of the selected NAND string is divided into two areas. An area at the source side of the selected word line that can contain a number of programmed (or erased cells) memory cells and an area at the drain side of the selected word line in which the cells are still in the erased state. The two areas are separated by a word line that is biased to a low voltage, typically zero volts. Because of this separation, the two areas can be boosted to different potentials. In almost all cases, the area at the drain side of the selected word line will be boosted to a higher potential than the area at the source side. Since the highest boosted area is the area with the erased cells, this boosting method is referred to as Erased Area Self Boosting (EASB). FIGS. 5A and 5B depict the operation of EASB.

FIG. 5A shows a NAND string being programmed. The NAND string includes eight memory cells 404, 406, 408, 410, 412, 414, 416 and 418. Each of the eight memory cells includes a control gate (CG) and a floating gate (FG). The NAND string also includes a drain side select gate 424 connecting the NAND string to the corresponding bit line via bit line contact 444, and a source side select gate 422 connecting the NAND string to common source line 442. Between each of the floating gates are source/drain regions 440. Memory cell 412, selected for programming, will receive programming voltage Vpgm at its control gate. The source side neighbor, memory cell 410, will receive zero volts (or a potential close to zero) at its control gate. The remaining non-selected memory cells will receive Vpass at their control gates. The source side select gate is in an isolating state, typically receiving a zero volt gate voltage. A low voltage can also be applied to the common source line 442; however, it can also slightly higher to improve the isolation characteristics of source side select gate 422. A voltage Vsgd, which is typically in a similar range to supply voltage Vdd is applied to the gate of the drain side select gate 424. Zero volts is applied to the bit line contact via the corresponding bit line. Because the bit line is at zero volts, channel 446 will be at approximately zero volts. Because of the large differential voltage between the channel voltage and the floating gate voltage of memory cell 412, electrons will tunnel into the floating gate of memory cell 412, thereby, programming memory cell 412.

FIG. 5B depicts a NAND string being inhibited using EASB. The NAND string of FIG. 5B includes eight memory cells 450, 452, 454, 456, 458, 460, 462, and 464. Between each of the floating gate stacks are source/drain region 466. Drain side select gate 446 connects the NAND string to bit line contact 472. Source side select gate 448 connects the NAND string to the source line 442. Drain side select gate 446 receives Vsgd, which is at or near the power supply voltage Vdd. To inhibit memory cell 458, bit line contact 472 receives the power supply voltage Vdd (or another suitable inhibit voltage) via the corresponding bit line. As discussed above with respect to FIG. 4B, select gate 424 will cut off when the NAND string voltage gets high enough, therefore, allowing channel 470 to become highly boosted. Similarly, because memory cell 456 is receiving zero volts at its control gate, it also will cut off allowing channel 468 to become boosted. However, because some of the memory cells 450, 452 or 454 may be programmed, the boosting in channel 468 is likely to be lower than the boosting in channel in 470.

Although the two channel areas are separated by the word line connected to zero volts, this does not mean that the isolation between the two areas is perfect. The isolation properties of memory cell 456, referred to as the isolation cell, depend on the data that is programmed in that memory cell.

When the isolation cell is in the erased state, the threshold voltage is negative. As a result, some boosted charge can be transferred from the higher boosted range side to the lower boosted source side (e.g., from highly boosted channel 470 to lower boosted channel 468). So, when the threshold voltage of memory cell 456 is negative, the transistor may not turn off even when zero volts is applied to the word line. If the memory cell is on, the NAND string is not initially operating in EASB mode. Rather the string is operating in a mode that is similar to self boosting, which has the problems discussed above. Once the source side boosted potential reaches a certain level, the isolation cell will automatically be cut-off. This occurs when the source side boosted potential becomes higher than the absolute value of the threshold voltage of the cell. The probability that this type of leakage occurs can be decreased by using two or more isolation word lines instead of only one. For example, a technique called Revised Erased Area Self Boost (REASB) uses two or more isolation word lines that can all be biased differently. For example, the immediate source side neighbor word line (e.g. word line for memory cell 456) is at a low voltage (e.g. a similar voltage as Vdd). Two word lines over from the word line being programmed (e.g. word line for memory cell 454) is set at zero volts. For example, looking at FIG. 5B, memory cell 456 would receive Vdd at its word line and memory 454 would receive zero volts at its word line. For more information, see U.S. patent application Ser. No. 10/774,014, "Self-Boosting System For Flash Memory Cells," filed on Feb. 6, 2004, incorporated herein by reference in its entirety.

When the isolation cell (e.g., memory cell 456) is programmed to a high threshold voltage state, such as around three volts, the isolation will be very good since the transistor is in the off state at all times during the operation. However, even in that state, some leakage from the drain side boosted area 470 to the lower boosted source side area 468 may still occur due to punch-through between the drain and source of memory cell 456. This will become especially more severe for future generation NAND devices since the channel lengths will become shorter and, thus, punch-through can occur at lower voltage differences. To avoid punch-through, the P-type doping concentration in the channel area under the memory cell should be increased or two or more word lines should be biased to zero volts or near zero volts (as per the REASB method discussed above).

Another effect that can occur when the isolation cell is in a high threshold voltage state is Gate Induced Drain Leakage (GIDL), which is also referred to as Band-To-Band-Tunneling. When the isolation cells are in the high threshold voltage state, the floating gate potential of that cell is lower than zero volts and the drain side of the isolation cell is boosted to a high potential. As a result, a very high vertical electric field is present near the drain area of the isolation cell. This high electric field may cause Band-To-Band-Tunneling as depicted in FIG. 6. Note, however, that GIDL or Band-To-Band tunneling may not be the only breakdown or leakage mechanism that can occur on the drain side of the isolation cell. Breakdown or leakage at the side of the drain area due to a strong lateral electric field, possibly further enhanced by the strong vertical electric field due to the negatively biased gate, may also occur. Furthermore, breakdown or leakage at the bottom of the drain junction (drain to P-well) may occur as well. All these breakdown and/or leakage mechanisms will from hereon be referred to as boosting induced drain leakage (BIDL).

FIG. 6 shows a portion of the NAND string of FIG. 5B, with a zooming-in on the drain and a portion of the channel for isolation cell 456. Due to the vertical electric field discussed above, or due to the combination of a strong lateral and vertical field, there is a breakdown causing leakage. Holes are injected into the P-well at the channel from drain 466, and electrons leak into boosted channel 470. The leakage of electrons to boosted channel 470 can cause the boosted voltage to leak away prematurely, resulting in program disturb. Besides leakage of the boosted channel, the holes and electrons that were generated by the GIDL maybe accelerated in the high electric fields that are present in the device near the isolation cell. Hot holes and electrons maybe generated and injected in the gate oxides of the selected memory cell or other memory cells in the neighborhood of the selected memory cell. For example, hot hole injection may occur in the isolation cell since the gate of that cell is negatively biased which is favorable for hot hole injection. The injection of hot holes or electrons may cause undesired threshold voltage shifts in the memory cells, thus, causing program disturb or the gate oxides of the memory cells maybe degraded by the hot carriers causing other reliability problems. Boosting induced drain leakage should be reduced/suppressed as much as possible since it may degrade program disturb and other reliability characteristics of the memory cells.

As devices become smaller, the channel length of the individual memory cells become shorter. As channel lengths become shorter, it is harder to turn off memory cells because there is less isolation. To compensate, a higher concentration of P-type material can be used in the channel area. One example is to dope the channel using Boron. The more P-type material added, the greater the isolation between the source and drain regions. However, as more P-type material is introduced to the channel area, the electric field around the drain area during boosting, as discussed above, will get stronger. As the electric field increases, the chance that boosting induced drain leakage will occur increases as well. Thus, if there is not enough P-type material, the memory cell could experience punch-through and current can flow when it is not desired. On the other hand, too much P-type material could cause boosting induced drain leakage due to an increased electric field around or in the drain. Note that the required concentration of P-type material in the channel area is not only determined by punch-through during boosting, to maintain good or sufficiently good short channel behavior during a read operation is important as well. Too low of a concentration of P-type material in the channel will result in a memory cell threshold voltage that depends strongly on the length of the channel of the memory cell. This is undesired as certain variations in channel length are expected due to variations in the production process. The P-type doping concentration should be sufficiently high to ensure that a sufficiently high and stable threshold voltage can be maintained even when the channel length varies within a certain range.

Some prior art devices (i.e. MOS transistors used in logic devices) have attempted to reduce the sensitivity to channel length variations by doping the portions of the channel closest to the source and drain regions with Boron to create what is called a B-Halo type of doping profile (referred to as B-Halo from hereon).

FIGS. 7A-7D depict a summary of a process for making NAND flash memory, that can include a B-Halo implantation. FIG. 7A shows a P-well area being created by ion implantation techniques. This P-well can be formed by one implantation step or by a combination of multiple implantation steps. Typically, Boron is used for the P-well implantation, however, other materials or impurities can be used or added as well. The function of the P-well is to isolate NAND strings from another and to isolate NAND strings from neighboring devices such as peripheral transistors. The isolation of devices is usually done in combination with Shallow Trench Isolation (not depicted). During the P-well implantation, it is possible to define the doping profile in the channel area at the same time. Sometimes, a low energy Boron implantation is used to define the channel doping profile.

Subsequently, the stacked gate structures are formed. For a flash memory device, the stacked gate structure can include a tunnel oxide layer, floating gate, interpoly isolation layer and control gate (and/or word line). FIG. 7B shows the device after the stacked gate structures are formed. FIG. 7B shows two NAND strings, referred to as even and odd strings. The even NAND string includes memory cells 380, source side select gate 384 and drain side select gate 386. The odd NAND string includes memory cells 382, source side select gate 388 and drain side select gate 390.

After forming the stacked gate structures, the source/drain regions are formed. FIG. 7C depicts an n-type implantation (e.g., Arsenic and/or Phosphorus) forming the source/drain regions. This implantation can be performed perpendicular to the Silicon substrate or angled as depicted in FIG. 7C. As part of the process depicted in FIG. 7C, a B-Halo implantation maybe added to reduce short channel effects.

Subsequently, if considered required, an additional implantation can be performed in the select gate areas, as depicted in FIG. 7D. In that case, the memory cells and part of the select gates are covered with a mask to prevent implantation of impurities in those regions. Only in the areas between the select gates are the extra impurities implanted. In some cases, additional Boron is implanted to increase the threshold voltage of the select gate transistors. The implantation can also be angled (not depicted). As the select gate transistors are used as isolation devices during read and write operations, their threshold voltage should be sufficiently high to achieve sufficient isolation.

A disadvantage of using a B-Halo type of structure for the memory cells, however, is that the transition from N-type to P-type material is steep since both a P-type and N-type material are implanted in the same area with relatively high doses. This steep doping profile may increase the boosting induced drain leakage due to the increased electric field around and in the drain, and therefore, result in degraded program disturb behavior. Even when the B-Halo technique is not used, scaling devices requires a higher P-type concentration in the channel area of the memory cells to avoid punch-through during boosting or threshold voltage variations during read (short channel effect), which will also result in increased electric field strengths around or in the drain and therefore increase the probability of boosting induced drain leakage. Thus, the requirements for scaling the memory cell and reducing boosting induced drain leakage are conflicting. To scale the memory cell, higher P-type concentrations are needed, while for boosting induced drain leakage reduction lower P-type and N-type concentrations are beneficial. As a result, scaling the memory cells can result in an increase in boosting induced drain leakage, and program disturb may deteriorate with each process generation.

Thus, there is a need for a better mechanism to prevent program disturb.

SUMMARY OF THE INVENTION

An asymmetrical memory cell doping profile in which the source side and the drain side of the memory cells are doped differently optimizes a balance between boosting induced drain leakage and the short channel effect. To reduce the short channel effect, a B-Halo type of implantation with a relatively high dose is used at the source side of the memory cell. At the drain side of the cell, no B-Halo is implanted at all or only a relatively low B-Halo dose is implanted. At the source side of the cell, a relatively high dose n-type implantation is used to create the source since the n-type implantation should result in a higher concentration than the B-Halo that is also implanted in the same area. Furthermore, the n-type area can be created in such a way that the floating gate overlaps the source n-type area to a certain extend to ensure that electrons from the source area can flow to the channel area under the floating gate without experiencing too large of a series resistance that could be caused by insufficient overlap of the floating gate and source. At the drain side of the cell, a lower dose n-type implantation can be used since because of the lower Boron concentration at the drain side, a lower n-type dose is sufficient to create an overlap of the floating gate with the drain area. It is even possible to reduce the effective Boron concentration, or more accurately, reduce the effective p-type concentration, at the drain side by implanting a low dose n-type counter implantation that compensates part of the boron at the drain side. Such a counter implantation could for example be done with Phosphorus but can also be done with an Arsenic implantation having a higher energy (and lower dose) than normally used in a drain/source type of implantation. The above memory cell can have good short channel properties and a sufficiently high threshold voltage, while at the same time have good boosting induced drain leakage properties. The short channel characteristics are mainly determined by the B-Halo implantation at the source side of the memory cell, while the boosting induced drain leakage characteristics are mainly determined by the doping profile at the drain side of the memory cell. The doping profile at the drain side can be made less steep than at the source side because both the p-type and n-type doping concentrations at the drain side can be lower.

It is also possible to create an asymmetric memory cell doping profile without using a B-Halo type of implantation. In that case, a sufficiently high channel implantation, that is typically performed as part of the P-well implantation, has to be used. The channel implantation is typically a Boron implantation with a low implantation energy so that the Boron atoms are implanted close to the silicon interface in the channel area of the memory cells. To create the asymmetrical doping profile requires again two separate implantations for the source and drain areas of the memory cells. At the source side, only a relatively high dose n-type implantation is used to create the source. At the drain side, a different n-type or a combination of two n-type implantations should be used. One of the implantations should be done with an appropriate material (such as Phosphorus) and implantation energy as to compensate part of the p-type channel implantation. In this manner, a region with a reduced effective p-type concentration can be created at the drain side of the memory cell. A second n-type implantation may be used that is shallower (typically using Arsenic) and has a higher doping concentration to reduce the resistance of the drain area and to improve the gate and drain overlap with the aim of reducing the resistance as well. Note that the latter implantation may not be needed in all cases.

One embodiment for making such a memory cell includes creating the stacked gate structures of a NAND string, performing source implantation and performing drain implantation. The source implantation is performed at a first implantation angle to areas between the stacked gate structures. The drain implantation is performed at a second implantation angle to areas between the stacked gate structures. The second implantation angle is different than the first implantation angle. For example, the two angles may have the same (or similar) magnitude, but be different directions (e.g., +3 degrees and −3 degrees). This process will create a plurality of stacked gate structures positioned on the substrate and asymmetrically doped source/drain regions in the substrate between the stacked gate structures.

One example of a memory cell includes a substrate for building a NAND string and a stacked gate structure positioned on the substrate above a channel area in the substrate. The stacked gate structure is part of the NAND string. The apparatus further includes a first source/drain region in the substrate and a second source/drain region in the substrate, both of which are adjacent to and on opposite sides of the channel area. The first source/drain region and the second source drain/region include lower doped regions of a first conductivity type on a drain side of the source/drain regions. The first source/drain region and said second source/drain region further include higher doped regions of the first conductivity type on a source side of the source/drain regions. In some embodiments, the channel area next to the first source/drain region and the second source/drain region includes a lower doped region of a second conductivity type near the drain side of the channel. The channel area next to the first source/drain region and the second source/drain region includes a higher doped region of a second conductivity type near the source side of the channel.

BRIEF DESCRIPTION OF THE DRAWINGS

FIG. 4A shows a NAND string being programmed.

FIG. 4B shows a NAND string being inhibited, using a self boosting method.

FIG. 5A shows a NAND string being programmed.

FIG. 5B shows a NAND string being inhibited, using an Erased Area Self Boosting method.

FIGS. 7A-7D depict a portion of a process for fabricating flash memory.

FIGS. 11A-11F depict a portion of a process for fabricating flash memory.

FIGS. 12A and 12B depict alternatives for fabricating flash memory.

FIGS. 13A-13F depict a portion of a process for fabricating flash memory.

FIGS. 14A-14B depict a portion of a process for fabricating flash memory.

DETAILED DESCRIPTION

Scaling of the memory cell dimensions is possible while not necessarily degrading the boosting induced drain leakage behavior of the memory cell by using an asymmetrical memory cell doping profile in which the source side and the drain side of the memory cells are doped differently, and/or the channel is doped asymmetrical. FIGS. 8A-E provide a number of embodiments of such a memory cell.

Figure 1:
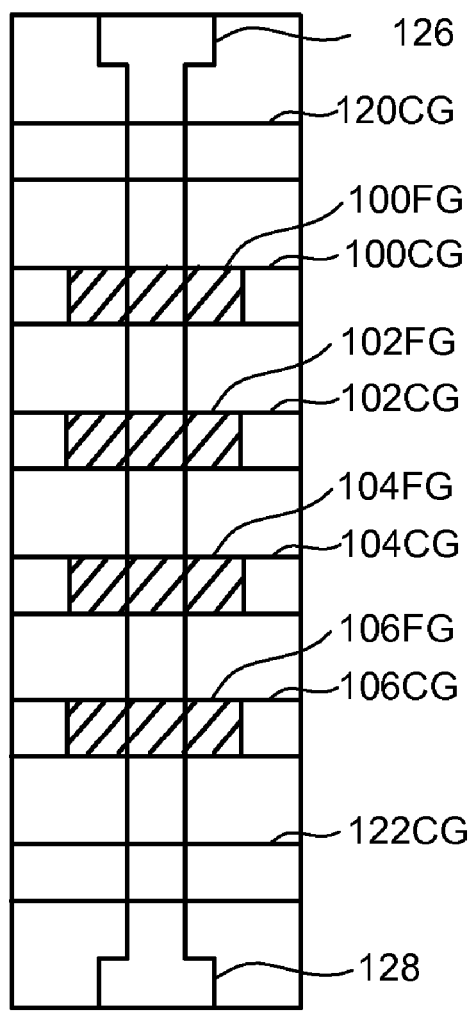
FIG. 1 is a top view of a NAND string.
Figure 2:
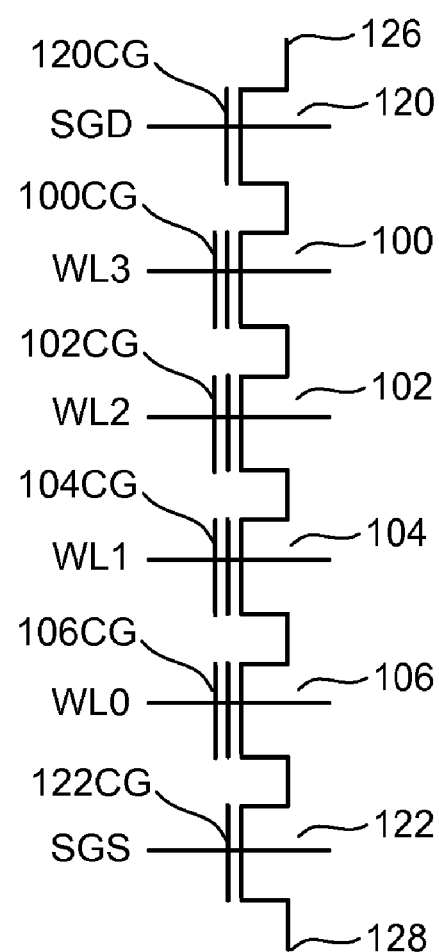
FIG. 2 is an equivalent circuit diagram of the NAND string.
Figure 3:
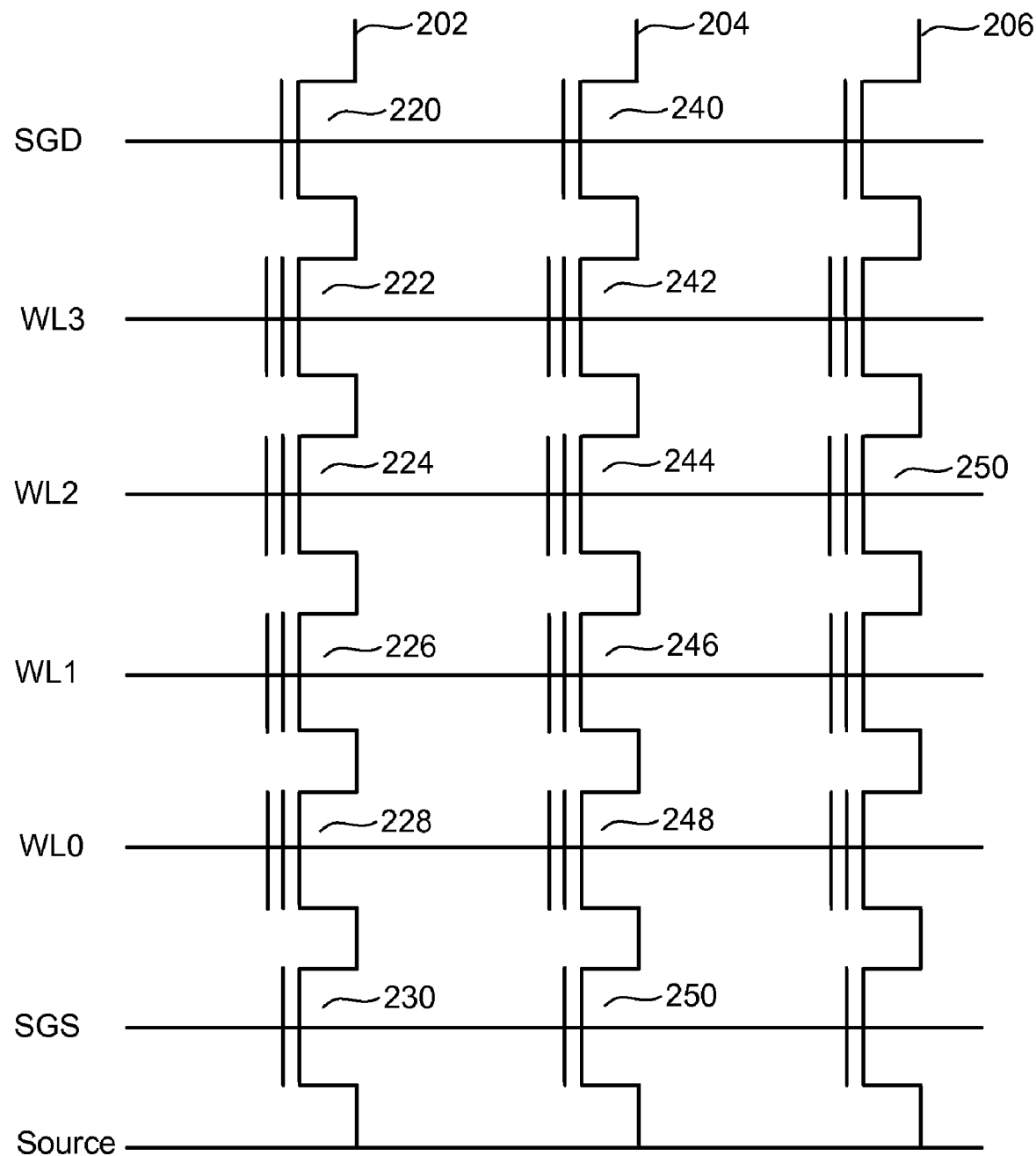
FIG. 3 is a schematic diagram depicting three NAND strings.
Figure 6:
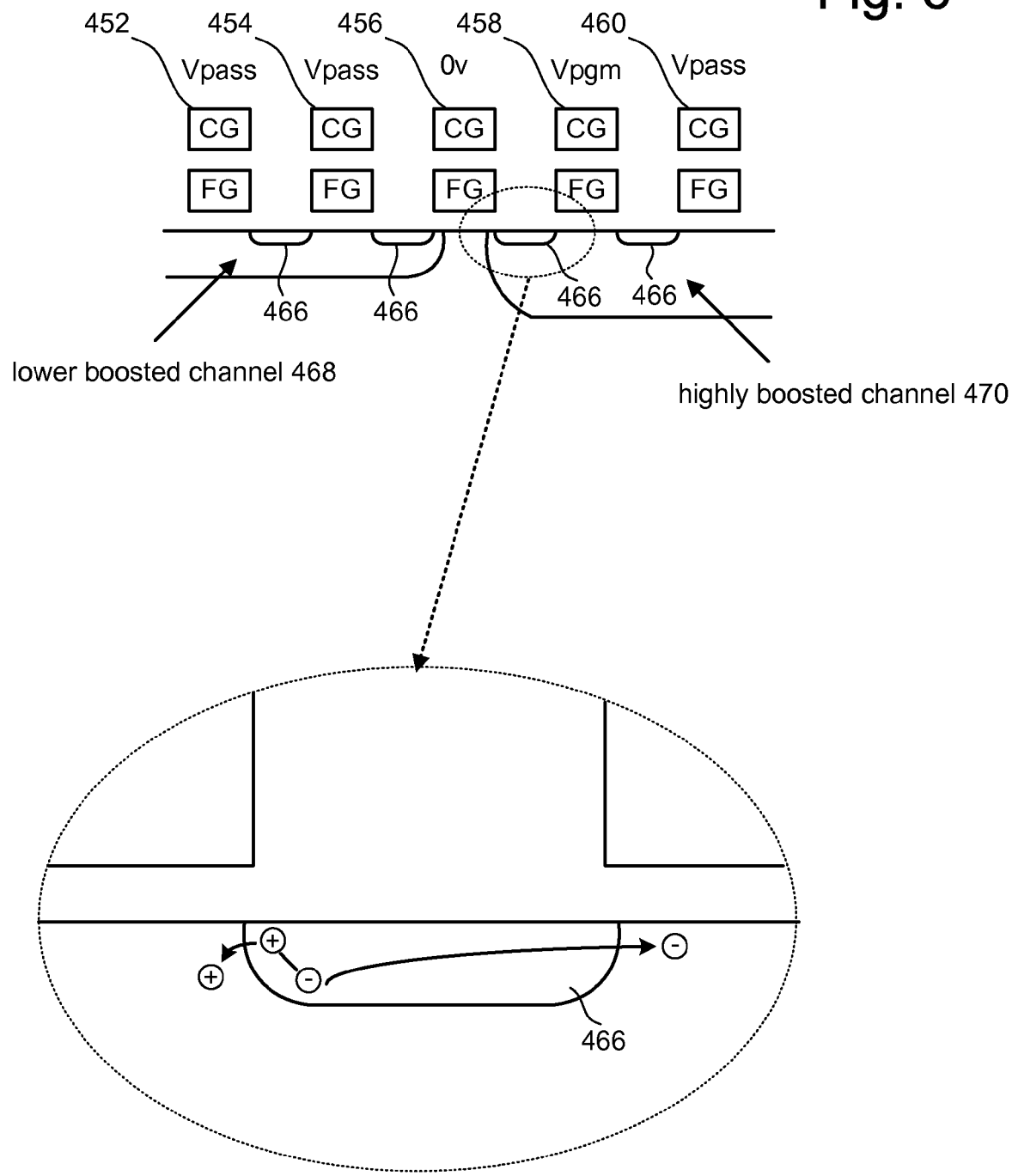
FIG. 6 depicts a portion of a NAND string.
Figure 8A:
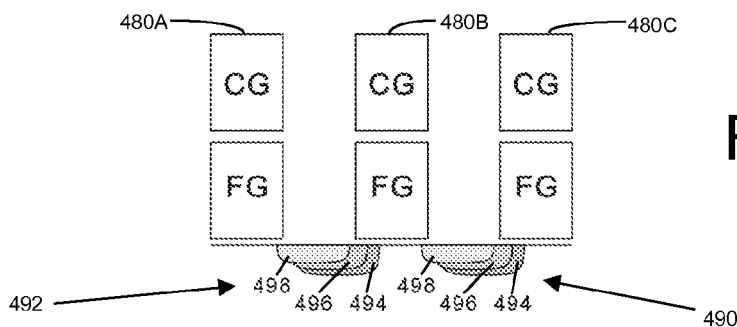
FIGS. 8A-E depicts examples of flash memory cells.

The structure of FIGS. 8A-E includes a P-type substrate (e.g., Silicon), an N-well within the substrate and a P-well within the N-well (all of which are not depicted to make the drawings more readable). Note that the P-well may contain a so called channel implantation that is usually a P-type implantation that determines or helps to determine the threshold voltage and other characteristics of the memory cells. FIGS. 8A-E show three stacked gate structures 480A, 480B and 480C that are formed on the top surface of the P-well. The stacked gate structures are part of a NAND string. The stacked gate structures includes a floating gate FG, a control gate CG, an interpoly dielectric layer (made of, for example, an oxide/nitride/oxide like structure) between the control gate CG and the floating gate FG, and a tunnel dielectric layer (typically made of $SiO_2$) positioned on the top surface of the P-well (between the P-well and the floating gate FG). The floating gate FG and the control gate CG can be made of polysilicon or another suitable material. In one embodiment, the control gate is part of a word line. In the P-well, on either side of stacked gate structures, are source/drain regions. For example, FIG. 8A shows source/drain regions 490 and 492. With respect to stacked gate structure 480B, region 490 acts as a drain and region 492 acts as a source. Similarly, region 490 is a source region for stacked gate structure 480C and region 492 is a drain region for stacked gate structure 480A. In other embodiments, the source and drain can be switched. Below the stacked gate structures, in the substrate, are channel regions.

In one embodiment, the source/drain regions 490 and 492 are asymmetrical, as depicted in FIG. 8A. The asymmetrical structure optimizes both boosting induced drain leakage and the short channel effect at the same time. To reduce the short channel effect, a high dose B-Halo type of implantation 494 is formed in the substrate (P-well) at the source side of the memory cell. The B-halo can be considered an additional channel implantation. At the drain side of the channel, no B-Halo is implanted at all or only a relatively low B-Halo dose is implanted at the drain side. At the source side of the cell, a relatively high dose n-type (N+) implantation 496 is used to create the source since the n-type implantation should be a higher concentration than the B-Halo that is also implanted in the same area. Furthermore, the n-type area is created in such a way that floating gate FG overlaps the source n-type area 496 to ensure that electrons from the source area can flow to the channel area under floating gate FG without experiencing too large a series resistance that could be caused by insufficient overlap of the floating gate and source. At the drain side of the cell, a lower dose n-type (N−) implantation 498 can be used because of the lower Boron concentration at the drain side. A lower n-type dose is sufficient to create an overlap of floating gate FG with the region 498 of the drain area. Note that the B-Halo implantation 494 typically (but not always) extends deeper into the substrate than the n-type implantations 496 and 498 so that the Boron implantation forms a Halo around or at least partially around the n-type implantation 496 and in some cases even around n-type implantation 498. Also note that in some embodiments (but not all embodiments) the relatively high dose n-type (N+) implantation 496 extends deeper into the substrate than lower dose n-type (N−) implantation 498.

Figure 8B:
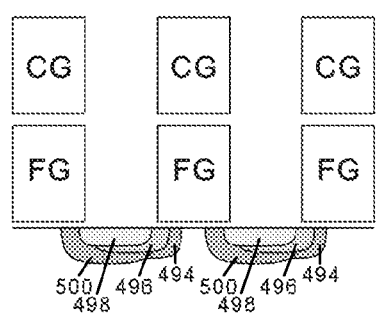

It is possible to reduce the effective Boron concentration at the drain side by implanting a low dose n-type counter implantation in the substrate (P-well) that partly compensates the Boron at the drain side. Such a situation is depicted in FIG. 8B where the region 500 corresponds with a low dose n-type counter implantation. Such a counter implantation could, for example, be implemented with Phosphorus, but can also be done with an Arsenic implantation with a higher energy (and lower dose) than normally used for a drain/source type of implantation. The n-type counter implantation can result in a region that is n-type (e.g. N−) or p-type (P−) depending on the original channel doping profile and the dose and energy of the counter implant. That is, a lower doped region of a second conductivity type (the lower channel doping at the drain region) can be realized by counter doping techniques where a low dose impurity of a first conductivity type is implanted to reduce the effective concentration in the second conductivity type region. In one embodiment, region 500 is an effectively lower doped p-type (P−) region. Thus, the counter implantation reduces the effective concentration of p-type material, rather than reversing the type for region 500. As a result of using a B-Halo and/or the counter implantation, the channel region is asymmetrically doped. Throughout this text, a source/drain area is considered to be an area that is effectively an area of a first conductivity type while a channel area is defined as an area that is effectively an area of a second conductivity type in between two drain/source areas. In both the channel and drain/source areas, both n- and p-type impurities can be present, however, in the channel area, the effective or net doping is p-type while in the drain/source areas, the effective or net doping is n-type.

Figure 8C:
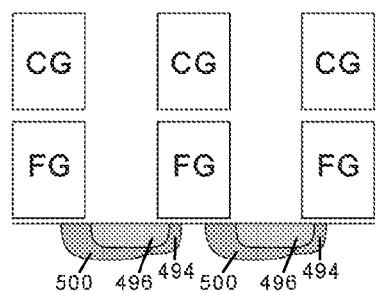

In some cases, it maybe possible to skip implantation 498 as is depicted in FIG. 8C. FIG. 8C shows a high dose n-type (N+) implantation 496, B-halo 494 and counter implantation region 500, without implantation 498. In this case, implantation 500 acts both as a counter implantation, reducing the effective channel doping in the channel near the drain side, and as the drain side implantation to create an area where the floating gate partially overlaps the drain area.

Figure 8D:
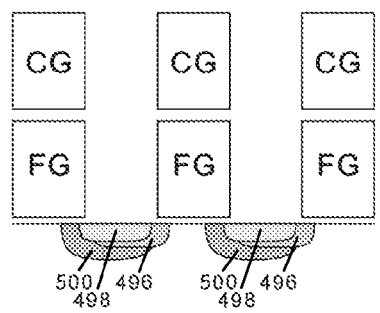
Figure 8E:
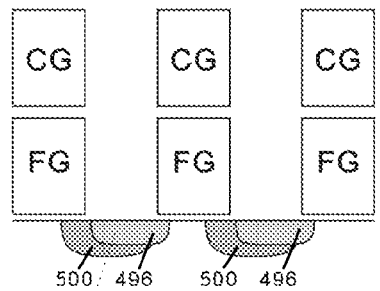

In some embodiments that use counter implantation 500, it may be possible to skip the B-Halo implantation 494 and solely use the normal channel implantation to define the threshold voltage and other characteristics of the memory cell. Such a situation is depicted in FIG. 8D and FIG. 8E. FIG. 8D shows the source/drain regions including high dose n-type (N+) implantation 496, lower dose n-type (N+) implantation 498 and implantation 500, without B-halo 494. FIG. 8E shows the source/drain regions including high dose n-type (N+) implantation 496 and low dose n-type counter implantation 500, without B-halo 494. The asymmetric memory cell doping profiles are in this case created by implanting the above mentioned low dose n-type counter implantation at the drain side of the cell to create both an asymmetrical channel and asymmetrical source/drain doping profile. The difference between FIG. 8D and 8E is that in FIG. 8D both a counter implantation 500 and a drain implantation 498 are used, while in FIG. 8E only one drain implantation 500 is used that acts both as the counter implantation and the drain implantation to define the overlap of the floating gate over the drain area. Instead of using drain implantation 500 as a counter implantation to reduce the effective channel doping concentration, the doping concentration can be increased to create a lightly doped n-type area. Thus effectively creating a lightly doped n-type area (drain area) under the floating gate.

It can be asserted that when trying to make an asymmetrical channel, by for example adding a B-Halo, the source/drain region will also become asymmetrical to a certain extent since the B-Halo will partly compensate the source/drain implantation in at least a part of the drain/source region, thereby modifying the effective doping profile of the drain/source region. For the same reasons, when making asymmetric drain/source regions, the channel region will also become asymmetrical to a certain extent.

The above memory cells can have good short channel properties and a sufficiently high threshold voltage, and at the same time have good GIDL and/or boosting induced drain leakage properties. The short channel characteristics (e.g., avoiding punch-through) are mainly determined by the B-Halo implantation and/or the channel implantation at the source side of the memory cell. The boosting induced drain leakage characteristics are mainly determined by the doping profile at the drain side of the memory cell. The doping profile at the drain side can be made less steep than at the source side because both the p-type and n-type doping concentrations at the drain side can be lower.

In alternative embodiments, the memory cells can be made in an N-well, possibly in combination with the use of an N-type substrate. One skilled in the art would know how to reverse the use of n-type and p-type materials for memory cells that are created in an N-well. The use of asymmetric drain/source doping profiles and/or asymmetric channel doping profiles as mentioned above, can also be used on NAND strings that are made on other substrate types, such as Silicon-On-Insulator.

The use of the asymmetric doping profiles is not limited to floating gate type of memories but may also be applicable in memory cells that use other types of material for the charge storage. For example, the asymmetric doping profiles can be used with memory devices that uses some kind of charge storage regions/layer(s) in between the control gate (or wordline) and the substrate, such as a nitride layer or small silicon islands, better known as nano-crystals.

Figure 9:
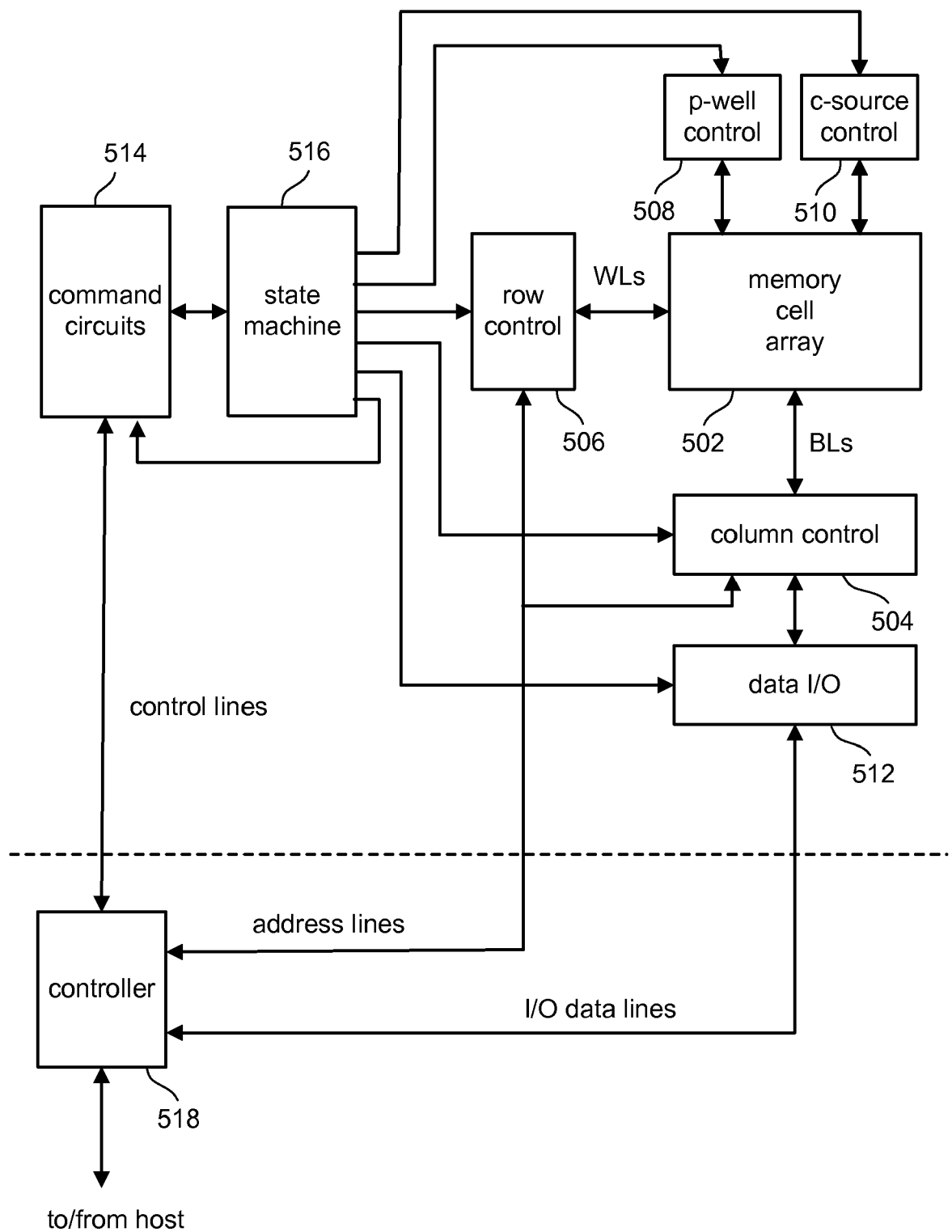
FIG. 9 is a block diagram of one example of a memory system that can be used to implement the present invention.

FIG. 9 is a block diagram of one embodiment of a flash memory system that can be used with the memory cell of FIG. 8. Memory cell array 502 is controlled by column control circuit 504, row control circuit 506, c-source control circuit 510 and p-well control circuit 508. Column control circuit 504 is connected to the bit lines of memory cell array 502 for reading data stored in the memory cells, for determining a state of the memory cells during a program operation, and for controlling potential levels of the bit lines to promote the programming or to inhibit the programming. Row control circuit 506 is connected to the word lines to select one of the word lines, to apply read voltages, to apply program voltages and to apply an erase voltage. C-source control circuit 510 controls a common source line (labeled as "C-source" in FIG. 10) connected to the memory cells. P-well control circuit 508 controls the p-well voltage during erase operations to, for example, apply positive voltages to the P-well while the word lines of a block that is selected for an erase operation are grounded.

The data stored in the memory cells are read out by the column control circuit 504 and are output to external I/O lines via data input/output buffer 512. Program data to be stored in the memory cells are input to the data input/output buffer 512 via the external I/O lines, and transferred to the column control circuit 504. The external I/O lines are connected to controller 518.

Command data for controlling the flash memory device is input to controller 518. The command data informs the flash memory of what operation is requested. The input command is transferred to state machine 516, which controls column control circuit 504, row control circuit 506, c-source control 510, p-well control circuit 508 and data input/output buffer 512. State machine 516 can also output status data of the flash memory such as READY/BUSY or PASS/FAIL.

Controller 518 is connected or connectable with a host system such as a personal computer, a digital camera, personal digital assistant, etc. Controller 518 communicates with the host in order to receive commands from the host, receive data from the host, provide data to the host and provide status information to the host. Controller 518 converts commands from the host into command signals that can be interpreted and executed by command circuits 514, which is in communication with state machine 516. Controller 518 typically contains buffer memory for the user data being written to or read from the memory array.

One exemplar memory system comprises one integrated circuit that includes controller 518, and one or more integrated circuit chips that each contain a memory array and associated control, input/output and state machine circuits. One embodiment includes integrating the memory arrays and controller circuits of a system together on one or more integrated circuit chips. The memory system may be embedded as part of the host system, or may be included in a memory card (or other package) that is removably inserted into the host systems. Such a removable card may include the entire memory system (e.g. including the controller) or just the memory chip(s) and associated peripheral circuits (with the Controller being embedded in the host). Thus, the controller can be embedded in the host or included within a removable memory system.

In some implementations, some of the components of FIG. 9 can be combined. In various designs, all or some of the components of FIG. 9, other than memory cell array 502, can be thought of as control circuits or a control circuit.

Figure 10:
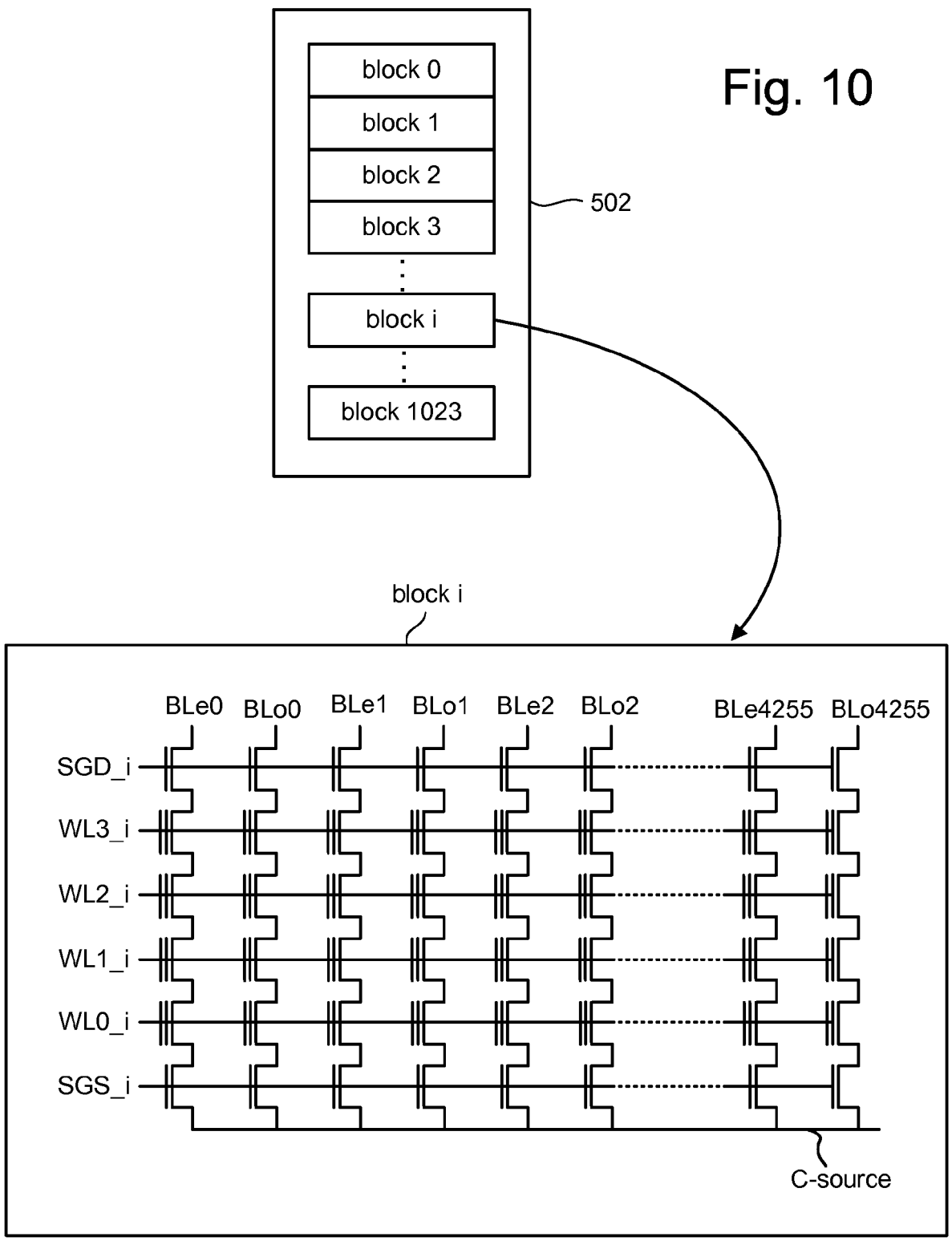
FIG. 10 illustrates an example of an organization of a memory array.

FIG. 10 depicts an example of an organization of memory cell array 502, using NAND memory cells. Memory cell array 502 is partitioned into 1,024 blocks block 0, block 1, . . . , block 1023). The NAND strings form columns of NAND strings connected together by bit lines and source lines. In one embodiment, each NAND string along the column is in a different block and every other NAND string is at a different orientation. That is, the NAND strings in even blocks (e.g., block 0, block 2, block 4, . . . block 1022) are at one orientation and the NAND strings in odd blocks (e.g., block 1, block 3, block 5, . . . , block 1023) are at an opposite orientation. This is because a particular NAND string in a given even block will border a first neighboring NAND string via a source line and will border a second neighboring NAND string via a bit line contact. This concept will be better explained below with respect to FIGS. 11-13.

In each block, in this example, there are 8,512 columns that are divided into even columns and odd columns. The bit lines are also divided into even bit lines (BLe) and odd bit lines (BLo). FIG. 10 shows four memory cells connected in series to form a NAND string. Although four cells are depicted to be included in each NAND string, more or less than four memory cells can be used. One terminal of the NAND string is connected to the corresponding bit line via a first select transistor SGD and a bit line contact, and another terminal is connected to c-source via a second select transistor SGS.

The data stored in each block is simultaneously erased. In one embodiment, the block is the minimum unit of cells that are simultaneously erased. Memory cells are erased in one embodiment by raising the p-well to an erase voltage (e.g. 20 volts) and grounding the word lines of a selected block while the source and bit lines are floating. Due to capacitive coupling, the unselected word lines, bit lines, select lines, and c-source are also raised to a high voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell becomes negative. Erasing can be performed on the entire memory array, separate blocks, or another unit of cells.

During read and programming operations, 4,256 memory cells are simultaneously selected. The memory cells selected share the same word line and the same kind of bit line (e.g. even bit lines or odd bit lines). Therefore, 532 bytes of data can be read or programmed simultaneously. In one embodiment, these 532 bytes of data that are simultaneously read or programmed form a logical page. Therefore, one block can store at least eight logical pages (four word lines, each with odd and even pages). When each memory cell stores two bits of data (e.g. a multi-level cell), one block stores 16 logical pages. Other sized blocks and pages can also be used with the present invention. Additionally, architectures other than that of FIGS. 9 and 10 can also be used to implement the present invention.

Programming is performed as discussed above, using EASB, REASB or other boosting schemes.

In the read and verify operations, the select gates (SGD and SGS) and the unselected word lines (e.g., WL0, WL1 and WL3) are raised to a read pass voltage (e.g. 4.5 volts) to make the transistors operate as pass gates. The selected word line (e.g. WL2) is connected to a voltage, a level of which is specified for each read and verify operation in order to determine whether a threshold voltage of the concerned memory cell has reached such level. For example, in a read operation for a two level memory cell, the selected word line WL2 may be grounded so that it is detected whether the threshold voltage is higher than 0V. In a verify operation for a two level memory cell, the selected word line WL2 is connected to 0.8V, for example, so that it is verified whether the threshold voltage has reached at least 0.8V. The source and p-well are at zero volts. The selected bit lines (BLe) are pre-charged to a level of, for example, 0.7V. If the threshold voltage is higher than the read or verify level on the word line, the potential level of the concerned bit line (BLe) maintains the high level because of the non-conductive memory cell. On the other hand, if the threshold voltage is lower than the read or verify level, the potential level of the concerned bit line (BLe) decreases to a lower level by the end of sensing integration time, for example less than 0.3V, because of the conductive memory cell. The state of the memory cell is, thereby, detected by a sense amplifier that is connected to the bit line.

The erase, read and verify operations described above are performed according to techniques known in the art. Thus, many of the details explained can be varied by one skilled in the art. Other erase, read and verify techniques known in the art can also be used.

FIGS. 11A-11F provide an example of a process for manufacturing the memory cell of FIG. 8, for use in the system described above with respect to FIGS. 9 and 10 (or in other systems). In some of the prior art systems, memory cell doping profiles for the source and drain are symmetrical. This is because both the memory cells in the even and odd blocks are defined at the same time. By using separate mask steps for even and odd blocks, it is possible to create asymmetrical memory cell doping profiles for both the even and odd blocks. Such a sequence is depicted in FIGS. 11A-11F.

FIGS. 11A-11F show two NAND strings, including an even NAND string and an odd NAND string. The even NAND string includes memory cells 600. The odd NAND string includes memory cells 602. Note that only four memory cells are shown in each of the two NAND strings. Four memory cells are depicted for example purposes only. Typical NAND strings are likely to have more than four memory cells, but could have less. For example, in some embodiments, NAND string may have 16, 32 or another amount of memory cells in the NAND string. However, the present invention is not limited to any particular number of memory cells in a NAND string. The even NAND string includes a drain side select gate 606 and a source side select gate 604. The odd NAND string includes a drain side select gate 608 and a source side select gate 610. A bit line contact is positioned between select gate 608 and select gate 606. A portion of an additional odd NAND string is depicted in FIGS. 11A-11F, including memory cell 614 and source side select gate 612. There will be a source line positioned between select gates 612 and 604. Similarly, a portion of an additional even NAND string is depicted, including memory cell 618 and source side select gate 616. A source line will be positioned between select gate 610 and select gate 616. As can be seen, the even NAND string has the source on the left and the drain on the right, while the odd NAND string has the drain on the left and source on the right; therefore, the odd and even NAND strings are at opposite orientations. FIG. 11A shows the NAND strings during the manufacturing process after the stacked gate structures have been formed on the P-well. Many different methods for forming the stacked gate structures can be used with the current invention.

FIG. 11B depicts the process of providing the source implantation for the even blocks. In one embodiment, the source implantation will include a B-Halo type implantation that provides a B-Halo type of doping profile (see e.g., B-Halo 494 of FIG. 8), which defines the threshold voltage and isolation properties of the memory cell. Additionally, the source implantation will include an n-type implantation. One example of a suitable n-type implantation includes using Arsenic to define the n-type source area (e.g., region 496 of FIG. 8). In one embodiment, the source implantation is provided at an angle, as depicted by the arrows in FIG. 11B. In one implementation, the implantation is at an angle in the range of 3-4 degrees. Other angles less than or more than that range can also be used. The angle should be small enough so that the dopants will reach the P-well through the gaps between the stack gate structures. The resulting source regions 652 are formed between the stacked gate structures of the even block. In addition, during the step of FIG. 11B, regions 654 are formed between the select gates. No source regions are formed on the odd NAND string because mask 650 blocks the implantation.

After the source implantation is performed for the even block, the drain implantation is done for the even block, as depicted in FIG. 11C. The process of FIG. 11C may include a lighter B-Halo, no B-Halo, a low dose n-type implantation (for example, phosphorous) to compensate for part of the B-halo source implantation or to compensate part of the channel implantation in case no B-Halo source implantation is used, or to create a lightly doped n-type area, and/or a higher dose n-type implantation such as Arsenic to form the drain side (e.g. region 498 of FIG. 8) of the memory cell. The resulting source/drain regions 656 are depicted in FIG. 11C for the NAND string in the even block. The region 658 between the select gates also receives the source implantation depicted in FIG. 11C. At this point, the asymmetrical source drain regions and/or asymmetrical channel regions are formed for NAND strings in the even blocks. The drain implantation of FIG. 11C is performed at an angle, similar (but not required to be the same) in magnitude but opposite in direction (different angular orientation) to the source implantation discussed above with respect to FIG. 11B. For example, if the source implantation is performed at +3 degrees from vertical, the drain implantation may be performed at −3 degrees from vertical. Note that the implantations can be performed at one or more angles, such that the one or more angles are at or near +3 or −3 degrees (or another suitable angle).

FIG. 11D depicts the odd block source implantation, which may include a B-Halo implantation. Mask 660 is used to block implantation for the even blocks. Source regions 662 are formed between the stacked gate structures of the odd blocks. In one embodiment, the source implantation of FIG. 11D is done at an angle, similar to the angle described above for the even block drain implantation of FIG. 11C. Thus, the angle depicted in FIG. 11D is the same magnitude but opposite in direction to the angle of the even block source implantation of FIG. 11B. As discussed above with respect to FIG. 11B, the odd block source implantation may include a B-Halo type implantation and an n-type implantation, (e.g., Arsenic) to define the source area.

FIG. 11E depicts the odd block drain implantation. The implantation is carried out at an angle similar to the angles discussed above, however, opposite in direction to the source implantation of FIG. 11D. Thus, while the angle of FIG. 11D is depicted from right to left, the angle depicted in FIG. 11E is left to right. The odd block drain implantation of FIG. 11E may contain a lighter B-Halo, no B-Halo, a low dose n-type implantation, and/or a higher dose n-type implantation to form the drain side of the memory cell. In one embodiment, the processes of FIG. 11D and 11E are similar to the processes of FIG. 11A and 11B but for the odd blocks with the angles being in the reverse direction/orientation than for the even blocks. For example, the angle of implantation for FIGS. 11B and 11E may be approximately +3 degrees while the angle of implantation for FIGS. 11C and 11D maybe approximately −3 degrees. The source/drain regions 666 resulting from the process of FIG. 11E are similar to source drain region 656 of the even block, but are in an opposite orientation.

The source and bit line contact regions (label 668 in FIG. 11E) received both the odd block and even block source and drain implantations. The full dose of those implantations may be sufficient to keep good isolation properties for those select transistors. However, if that is not the case, an additional implantation can be done to tune the threshold voltages of the select gates. This can be done with the mask 660 still in place (since that mask will also mask out peripheral transistor areas), but by applying a larger implantation angle (e.g. 15 degrees) that additional implantation can be prevented from entering the memory cell areas. The spacing between the select gates (e.g. select gate 606 and select gate 608) is larger than that of the spacing between the memory cells 602 because the contact areas need to be formed in between those select gates. The larger space allows for larger implantation angles. For example, FIG. 11F shows an additional implantation step with a larger implantation angle so that implantation occurs between the select gates into areas 670 and not in the source/drain regions between the memory cells 602. Note that in one embodiment, the implantation of FIG. 11F can be performed at one or more angles, such that the one or more angles are near +15 and −15 degrees (or other suitable angles). In one example, the process of FIG. 11F also includes adding a B-Halo implantation at an implantation angle of 15 degrees (or other suitable value larger than the angle used in the steps of FIGS. 11B-E). In various embodiments, the additional implantation step of FIG. 11F can include n-type and/or p-type implantations. Additionally, note that the source implantation and/or the drain implantation can include multiple implantations of n-type and/or p-type materials that can be implanted using common or different angles (including 0 degrees), impurity types (i.e. Arsenic or Phosphorus), doses and energies.

Note that it is also possible to do the steps depicted in FIGS. 11A-11F in different orders than described above. For example, the steps depicted in FIG. 11F can be performed after the odd block implantation, after the even block implantation or after both odd and even block implantations. Additionally, the odd block, in some embodiments, can be implanted prior to the even block being implanted. It may also be possible to perform some or all of the above-discussed implantations before completing the stacked gate structures. Various other orders of steps can also be used.

Although the figures described above show that the implantations are carried out as angled implantations, this is not necessary for all of the implantations. For example, it is possible to use perpendicular implantation for the source implantation while the drain implantation is performed at the angle described above. FIG. 12A provides such an example where the even block source implantation is provided perpendicular to the substrate. The same perpendicular source implants can be provided for the odd blocks. Subsequent to the perpendicular implantations of FIG. 12A, the implantation for the drain side would be at the angle discussed above with respect to FIG. 11C.

Another possibility is that the source implantation (FIGS. 11B and 11D) is provided at an angle as described above and the drain implantation (FIGS. 11C and 11E) is provided perpendicular to the substrate. FIG. 12B provides an example of the even block drain side implants being performed in a perpendicular fashion.

FIGS. 13A-13F depict another embodiment of a method to create asymmetrical memory cell doping profiles. In principal, this additional embodiment is similar to the embodiments described above. However, the masks are defined differently. That is, during the source and drain implantations, the areas between the drain side select gates are covered with the same mask as used to cover the memory cells in the relevant even or odd blocks. As a result, the areas between the two drain side select gates (including the bit line contact areas) are not implanted during the source and drain implantations. The areas between the source side select gates have, however, received the same implantation as the memory cells. During a subsequent step, an additional mask is applied and a dedicated implantation is performed for the area in between the drain side select gates. This dedicated implantation can include n-type and p-type implantations. If this implantation is limited to an n-type implantation, then this implantation will not result in an increase in the threshold voltage of the drain side select gate. It is more of a concern to have good isolation properties for the source side select gate. In some embodiments, this may not be as critical for the drain side select gate. In some implementations, a lower threshold voltage for the drain side select gate may even be beneficial. This may especially be the case at lower power supply voltages such as 1.8 volts where the lower Vsgd voltages need to be used.

FIGS. 13A shows the even block source implantation that may include a B-Halo implantation. The process of FIG. 13A is similar to the process of FIG. 11B. However, mask 680 is different than mask 650 of FIG. 11B. That is, mask 680 covers the area between drain side select gates 606 and 608; therefore, the area between those select gates 606 and 606 does not receive the implantation during the process of FIG. 13A while it does during the process of FIG. 11B. The process of FIG. 13B, even block drain implantation, is similar to the process of FIG. 11C. However, mask 680 of FIG. 13B is different than mask 650 of FIG. 11C, as described above.

The process of FIG. 13C, odd block source implantation, is similar to the process of FIG. 11D. However, mask 690 is different than that of mask 660. That is, mask 690 covers the region between drain side select gates 606 and 608 so that region does not receive implantation in the process of FIG. 13C. Similarly, the process of FIG. 13D, odd block drain implantation, is similar to the process of FIG. 11E. The process of FIG. 13D differs from the process of FIG. 11E in that the mask 690 covers the region between the drain side select gates, as discussed above. After the process of FIG. 13D, the region between the drain side select gates 606 and 608 has not been implanted.

The process of FIG. 13E, source line implantation, is similar to the process of FIG. 11F. The difference between FIG. 13E and FIG. 11F is that mask 690 covers the region between the drain side select gates 606 and 608. After the process of FIG. 13E, the region in the P-well between select gates 606 and 608 has not been implanted.

FIG. 13F depicts a process for performing the bit line contact implantation in the region between drain side select gates. Mask 700 is used to cover the NAND chains, except for the area between the drain side select gates, such as the area between drain side select gates 606 and 608. The implantation can consist of two angled implantations (same or similar magnitude, opposite direction), similar to the angles used for the process of FIG. 11F, however, it is not essential to angle the implantations so one or more or the bit line contact implantations may also be perpendicular to the substrate or the angles may be smaller. Furthermore, in some cases, this mask step and implantation may be combined with other mask steps that are needed for other devices, such as peripheral transistors.

Other embodiments can use different masks. For example, in one variation on the embodiment of FIGS. 13A-13F, during the source and drain implantations, the areas between the source side select gates can be covered with the same mask as used to cover the memory cells in the relevant even or odd blocks. As a result, the areas between the two source side select gates are not implanted during the source and drain implantations. The areas between the drain side select gates, however, receive the same implantations (both odd and even block implantations) as the memory cells. For example, FIG. 14 shows a process of providing the source implantation for the even blocks using a mask 720 that covers the odd blocks and covers the areas between the source side select gates. The same mask can be used for the drain implantation. An analogous mask can be used to cover the even blocks and the areas between the source side select gates during the odd block source and drain implantations.

During a subsequent step (after even and odd block implantations for the embodiment of FIG. 14A), an additional mask is applied and a dedicated implantation is performed for the area in between the source side select gates. In some cases, this mask step and implantation maybe combined with other mask steps that are needed for other devices, such as peripheral transistors. For example, FIG. 14B shows mask 740 covering the even blocks, odd blocks, and areas between the drain side select gates; however, mask 740 does not cover the area between the source side select gates. This implantation may have both n- and p-type implantations. The n-type implantation is required to form an n-type source region in between the two source side select gates. The p-type implantation, which maybe of B-Halo type, may be added to increase the threshold voltage of the source side select gates in order to ensure proper isolation properties of the source side select gates. This embodiment may especially be attractive when no B-Halo source implantation is used in the cell areas. In that case, an n-type counter implantation can be used at the drain side of the memory cells to create the asymmetrical memory cell doping profiles. Then, it is beneficial to prevent these n-type counter implantations (by masking the area in between the source side select gates) from entering the source side of the source side select gates as these implantations will reduce the threshold voltage of the source side select gates which may be undesired. A B-Halo type of implantation can additionally be done in the source side select gate area by an additional mask step that is also needed to implant an n-type source area in between the source side select gates, while the drain side select gates do not get any additional B-Halo type of implantation. As a result, the threshold voltage of the drain side select gates can be lower as those of the source side select gates, which can be beneficial for the operation of the memory array as described above.

Other embodiments can use different masks. For example, in one variation on the embodiment of FIGS. 13A-13F, during the source and drain implantations, the areas between both the source side select gates and the drain side select gates can be covered with the same mask as used to cover the memory cells in the relevant even or odd blocks. As a result, the areas between the two source side select gates and the two drain side select gates are not implanted during the source and drain implantations. An additional implantation in between the source side select gates and drain side select gates may be needed. If that is the case, additional mask and implantation steps are required to implant those regions. In some cases, these mask steps and implantations may be combined with other mask steps that are needed for other devices, such as peripheral transistors.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method for creating NAND flash memory, comprising:

creating stacked gate structures of a NAND string on a substrate;

performing source implantation at a first implantation angle to areas between said stacked gate structures; and performing drain implantation at a second implantation angle between said stacked gate structures of said NAND string, the first implantation angle differs from the second implantation angle;

said drain implantation creates lower doped regions of a first conductivity type in said substrate on drain sides of said stacked gate structures; and said source implantation creates higher doped regions of the first conductivity type in said substrate on source sides of said stacked gate structures, said higher doped regions are deeper in said substrate than said lower doped regions, said higher doped regions and said lower doped regions form combined source/drain regions.

* * * * *